United States Patent
Kurihara et al.

(10) Patent No.: US 6,813,735 B1
(45) Date of Patent: Nov. 2, 2004

(54) I/O BASED COLUMN REDUNDANCY FOR VIRTUAL GROUND WITH 2-BIT CELL FLASH MEMORY

(75) Inventors: Kazuhiro Kurihara, Sunnyvale, CA (US); Pau-Ling Chen, Saratoga, CA (US)

(73) Assignee: FASL, LLC., Sunnyvale, CA (US)

( * ) Notice: Subject to any disclaimer, the term of this patent is extended or adjusted under 35 U.S.C. 154(b) by 364 days.

(21) Appl. No.: 09/676,623

(22) Filed: Oct. 2, 2000

(51) Int. Cl.⁷ ............................................. G11C 29/00
(52) U.S. Cl. ...................................... 714/711; 714/718
(58) Field of Search ................................ 365/185, 154, 365/63, 49, 185.03, 233, 200, 185.09; 714/718, 710, 711; 326/65; 711/206

(56) References Cited

U.S. PATENT DOCUMENTS

| | | | | |
|---|---|---|---|---|
| 4,680,760 A | * | 7/1987 | Giles et al. ................. | 714/718 |
| 5,349,558 A | | 9/1994 | Cleveland et al. .......... | 365/200 |
| 5,694,359 A | | 12/1997 | Park ...................... | 365/185.09 |
| 5,729,551 A | * | 3/1998 | Park et al. .................. | 714/711 |
| 5,768,188 A | * | 6/1998 | Park et al. ............. | 365/185.03 |
| 5,999,450 A | * | 12/1999 | Dallabora et al. ..... | 365/185.09 |
| 6,006,313 A | | 12/1999 | Fukumoto ................... | 711/211 |
| 6,075,721 A | * | 6/2000 | Runaldue et al. ........... | 365/154 |
| 6,147,904 A | * | 11/2000 | Liron ..................... | 365/185.09 |
| 6,181,593 B1 | * | 1/2001 | Briner ......................... | 365/63 |
| 6,438,047 B1 | * | 8/2002 | Lee et al. .................. | 365/200 |

* cited by examiner

*Primary Examiner*—Guy J. Lamarre
*Assistant Examiner*—Mujtaba Chaudry

(57) ABSTRACT

The present invention discloses methods and systems of accomplishing I/O-based redundancy for a memory device that includes two-bit memory cells. The memory device includes a core two-bit memory cell array and a redundant two-bit memory cell array. The configuration of the core two-bit memory cell array is non-uniform such that the two-bit memory cells therein are not arranged in a sequential order. Due to the non-uniform configuration, I/O based redundancy is accomplished by decoding the addresses with a redundant Y-decoder circuit and translating the addresses using an address translation circuit. The translated addresses identify the location of the two-bit memory cells within the non-uniform core two-bit memory cell array. The decoding of the addresses configures the redundant two-bit memory cell array to provide a configuration that matches the two-bit memory cells in the location identified by the translated address.

25 Claims, 15 Drawing Sheets

|  | 190 ACOM(6) | | 192 ACOM(5) | | 194 ACOM(4) | | 196 ACOM(3) | | |
|---|---|---|---|---|---|---|---|---|---|
| 200 | 188 | 180 | 186 | 182 | 162 | 178 | 160 | 126 | 152 |
| Replaced MBL | A6 | XOR6_5 | A5 | A5B | A4 | XOR4_3 | A3 | A3B | A2_0 |
| 30, 31 | 0 | 1 | 0 | 1 | 0 | 1 | 0 | 1 | 0 |
| 0, 1 | 0 | 1 | 0 | 1 | 0 | 1 | 0 | 1 | 1 |
|  | 0 | 1 | 0 | 1 | 0 | 0 | 1 | 0 | 0 |
| 2, 3 | 0 | 1 | 0 | 1 | 0 | 0 | 1 | 0 | 1 |
|  | 0 | 1 | 0 | 1 | 1 | 0 | 0 | 1 | 0 |
| 4, 5 | 0 | 1 | 0 | 1 | 1 | 0 | 0 | 1 | 1 |
|  | 0 | 1 | 0 | 1 | 1 | 1 | 1 | 0 | 0 |
| 6, 7 | 0 | 1 | 0 | 1 | 1 | 1 | 1 | 0 | 1 |
|  | 0 | 0 | 1 | 0 | 0 | 1 | 0 | 1 | 0 |
| 8, 9 | 0 | 0 | 1 | 0 | 0 | 1 | 0 | 1 | 1 |
|  | 0 | 0 | 1 | 0 | 0 | 0 | 1 | 0 | 0 |
| 10, 11 | 0 | 0 | 1 | 0 | 0 | 0 | 1 | 0 | 1 |
|  | 0 | 0 | 1 | 0 | 1 | 0 | 0 | 1 | 0 |
| 12, 13 | 0 | 0 | 1 | 0 | 1 | 0 | 0 | 1 | 1 |
|  | 0 | 0 | 1 | 0 | 1 | 1 | 1 | 0 | 0 |
| 14, 15 | 0 | 0 | 1 | 0 | 1 | 1 | 1 | 0 | 1 |
|  | 1 | 0 | 0 | 1 | 0 | 1 | 0 | 1 | 0 |
| 16, 17 | 1 | 0 | 0 | 1 | 0 | 1 | 0 | 1 | 1 |
|  | 1 | 0 | 0 | 1 | 0 | 0 | 1 | 0 | 0 |
| 18, 19 | 1 | 0 | 0 | 1 | 0 | 0 | 1 | 0 | 1 |
|  | 1 | 0 | 0 | 1 | 1 | 0 | 0 | 1 | 0 |
| 20, 21 | 1 | 0 | 0 | 1 | 1 | 0 | 0 | 1 | 1 |
|  | 1 | 0 | 0 | 1 | 1 | 1 | 1 | 0 | 0 |
| 22, 23 | 1 | 0 | 0 | 1 | 1 | 1 | 1 | 0 | 1 |
|  | 1 | 1 | 1 | 0 | 0 | 1 | 0 | 1 | 0 |
| 24, 25 | 1 | 1 | 1 | 0 | 0 | 1 | 0 | 1 | 1 |
|  | 1 | 1 | 1 | 0 | 0 | 0 | 1 | 0 | 0 |
| 26, 27 | 1 | 1 | 1 | 0 | 0 | 0 | 1 | 0 | 1 |
|  | 1 | 1 | 1 | 0 | 1 | 0 | 0 | 1 | 0 |
| 28, 29 | 1 | 1 | 1 | 0 | 1 | 0 | 0 | 1 | 1 |
|  | 1 | 1 | 1 | 0 | 1 | 1 | 1 | 0 | 0 |
| 30, 31 | 1 | 1 | 1 | 0 | 1 | 1 | 1 | 0 | 1 |

FIG. 7

| Redundant Element | A2 | A1 | A0 | A0X | BSPvR0 | BSNvR0 | BSPvR1 | BSNvR1 | CSvR(0) | CSvR(1) | CSvR(2) | CSvR(3) | CSvR(4) | CSvR(5) | MBLvR SUPPLIED TO | MBTvR SUPPLIED TO |
|---|---|---|---|---|---|---|---|---|---|---|---|---|---|---|---|---|
| 0 | 0 | 0 | 0 | 0 | 0 | 0 | 1 | 1 | 0 | 0 | 1 | 1 | 0 | 0 | MBLvR(3) | MBLvR(2) |
| 0 | 0 | 0 | 1 | 1 | 1 | 1 | 0 | 0 | 1 | 1 | 0 | 0 | 0 | 0 | MBLvR(0) | MBLvR(1) |
| 0 | 0 | 1 | 0 | 1 | 1 | 1 | 0 | 0 | 0 | 1 | 1 | 0 | 0 | 0 | MBLvR(2) | MBLvR(1) |
| 0 | 0 | 1 | 1 | 0 | 0 | 0 | 1 | 1 | 0 | 1 | 1 | 0 | 0 | 0 | MBLvR(1) | MBLvR(2) |
| 0 | 1 | 0 | 0 | 0 | 0 | 0 | 1 | 1 | 0 | 1 | 1 | 0 | 0 | 0 | MBLvR(1) | MBLvR(2) |
| 0 | 1 | 0 | 1 | 1 | 1 | 1 | 0 | 0 | 0 | 1 | 1 | 0 | 0 | 0 | MBLvR(2) | MBLvR(1) |
| 0 | 1 | 1 | 0 | 1 | 1 | 1 | 0 | 0 | 0 | 1 | 1 | 0 | 0 | 0 | MBLvR(2) | MBLvR(1) |
| 0 | 1 | 1 | 1 | 0 | 0 | 0 | 1 | 1 | 0 | 1 | 1 | 0 | 0 | 0 | MBLvR(1) | MBLvR(2) |
| 1 | 0 | 0 | 0 | 0 | 0 | 0 | 1 | 1 | 0 | 0 | 0 | 0 | 1 | 1 | MBLvR(5) | MBLvR(4) |
| 1 | 0 | 0 | 1 | 1 | 1 | 1 | 0 | 0 | 0 | 1 | 1 | 0 | 0 | 0 | MBLvR(2) | MBLvR(3) |
| 1 | 0 | 1 | 0 | 1 | 1 | 1 | 0 | 0 | 0 | 0 | 1 | 1 | 0 | 0 | MBLvR(4) | MBLvR(3) |
| 1 | 0 | 1 | 1 | 0 | 0 | 0 | 1 | 1 | 0 | 0 | 1 | 1 | 0 | 0 | MBLvR(3) | MBLvR(4) |
| 1 | 1 | 0 | 0 | 0 | 0 | 0 | 1 | 1 | 0 | 0 | 1 | 1 | 0 | 0 | MBLvR(3) | MBLvR(4) |
| 1 | 1 | 0 | 1 | 1 | 1 | 1 | 0 | 0 | 0 | 0 | 1 | 1 | 0 | 0 | MBLvR(4) | MBLvR(3) |
| 1 | 1 | 1 | 0 | 1 | 1 | 1 | 0 | 0 | 0 | 0 | 1 | 1 | 0 | 0 | MBLvR(4) | MBLvR(3) |
| 1 | 1 | 1 | 1 | 0 | 0 | 0 | 1 | 1 | 0 | 0 | 1 | 1 | 0 | 0 | MBLvR(3) | MBLvR(4) |

FIG. 14

I/O BASED COLUMN REDUNDANCY FOR VIRTUAL GROUND WITH 2-BIT CELL FLASH MEMORY

FIELD OF THE INVENTION

The present invention is directed to the field of non-volatile memory and, more particularly, to I/O based redundancy in a nonvolatile memory array of memory cells capable of storing 2-bits per memory cell.

BACKGROUND

Computers, personal digital assistants, cellular telephones and other electronic systems and devices typically include processors and memory. The memory may be used to store instructions (typically in the form of computer programs) to be executed and/or data to be operated on by the processors to achieve the functionality of the device. In some applications, the systems and devices may require that the instructions and/or data be retained in some form of permanent/non-volatile storage medium to avoid information loss when the device is turned off or power is removed. Exemplary applications include computer Basic Input Output Systems (BIOS) storage and diskless handheld computing devices such as personal digital assistants.

One type of non-volatile memory that can be used is flash Electrically Erasable Programmable Read Only Memory ("EEPROM") that is commonly referred to as a flash memory. Flash memory is a form of non-volatile storage, which uses a memory cell design with a floating gate. Voltages are applied to the memory cell inputs to program/store charge on the floating gate or to erase/remove charge from the floating gate. Programming occurs by hot electron transfer to place charge on the floating gate, while erasure makes use of Fowler-Nordheim tunneling in which electrons pierce through a thin dielectric material to remove electronic charge from the floating gate.

One type of memory cells are known as two-bit memory cells due to the ability to store two-bits of data within the memory cell. In two-bit memory devices, a left and right region is used within the memory cell to store two-bits of data. In general, a cell is programmed in the conventional manner using hot electron programming by applying programming voltages to the gate and the left or right region while the other region is grounded.

The memory cell is read in the opposite direction from which it is programmed by similarly applying read voltages to the gate and the left or right region. Each bit can be individually read by using a relatively low gate voltage with polarity that is opposite to the programming voltages. The traditional drain and source of the two-bit memory cells are effectively swapped based on whether the two-bit memory cell is being programmed or erased. Programming and is reading one of the bits leaves the other bit with its information intact and undisturbed.

Flash memory is manufactured to form rows and columns of memory cells that result in a memory array. The memory array is accessed by a row decoder (a wordline decoder) and a column decoder (a bitline decoder). The decoders are used to apply predetermined voltages to a particular memory cell or row of memory cells in the memory array. A sense amplifier is built into the flash memory for sensing the logic value of the selected memory cell(s) when addressed by the row decoder and column decoder. In two-bit memory cells, the decoders control the supply of the programming and reading voltages to the gate and the left and right regions as previously discussed.

In recent years, the density of the memory array on a flash memory has increased dramatically. As the density of the memory array on a flash memory increases, it becomes significantly more difficult to produce perfect flash memory. During fabrication of the flash memory, it is common for the memory array to include one or more defective memory cells due to short circuits, open circuits and other operational defects. In an effort to improve production yields and flash memory reliability, spare or redundant memory cells are typically included on the flash memory. The redundant memory cells provide redundancy of data storage to allow for repair by replacement of the defective memory cells in the memory array.

The flash memory is generally first tested while it is part of a semiconductor wafer joined with other flash memory. If a faulty area containing defective memory cells is located, redundant memory cells are substituted for the defective memory cells in the faulty area. Typically, circuitry is required for selectively deactivating the defective memory cells and activating the redundant memory cells to effect the substitution.

The redundant memory cells and the memory cells in the array are sub-divided into a plurality of redundant blocks with each redundant block further sub-divided into a plurality of sectors. To allow repair of the defective memory cells by the redundant memory cells; an address of a column of defective memory cells is cross-referenced by the flash memory with the location of a column of redundant memory cells. One method of cross-referencing is by assigning an address storage location to the location of the column of redundant memory cells. The address storage location is typically also assigned to a particular redundant block to allow different repairs in different redundant blocks.

Column addresses of defective columns of memory cells that are stored in the particular address storage locations are located within the assigned redundant block location. The defective memory cells are repaired by the columns of redundant memory cells that are assigned to the particular address storage location. The column address of the defective memory cells is stored in the address storage location and later compared against a column address of memory cells that are active within the flash memory during operation. If the addresses match, substitution of the active column of memory cells with a column of redundant memory cells occurs.

A problem arises when the memory cells in a memory array are not addressed sequentially according to their physical location. In this situation, the addresses of the columns of memory cells do not correspond to their physical location within the redundant blocks. Due to the non-sequential configuration, the addressing of columns of memory cells cannot be directly stored to identify the location of the columns of memory cells that are defective. Accordingly, there is a need for systems and methods that are capable of providing redundancy where the order of the memory cells in the memory array are non-sequential.

SUMMARY

By way of introduction, this invention relates generally to floating gate memory devices such as an array of flash electrically erasable programmable read-only memory (EEPROM) cells with I/O-based redundancy. More particularly, the present invention relates to I/O-based redundancy for an array of two-bit flash EEPROM cells.

The presently preferred flash memory is capable of I/O based redundancy and includes a core two-bit memory cell array and a redundant two-bit memory cell array. The arrays are subdivided into a plurality of redundant blocks that each contain a plurality of sectors. Each of the sectors are further subdivided into a plurality of I/O blocks.

Within each of the I/O blocks, there are a plurality of two-bit memory cells arranged in columns and rows. The two-bit memory cells are arranged such that a bit identified as a zero bit is at the right edge of the I/O block and the remaining bits are sequentially numbered starting from the left edge of the I/O block. I/O based redundancy is described as "I/O based" since repairs are preformed on specific I/O (or bits) in a specified I/O block within a plurality of corresponding sectors in a specified redundant block. In general, I/O based redundancy allows for repairs within particular I/O blocks by electrically exchanging two-bit memory cells in the core two-bit memory cell array with redundant two-bit memory cells in the redundant two-bit memory cell array.

The flash memory uses addressing to selectively activate the two-bit memory cells and the redundant two-bit memory cells. During testing, when a column of two-bit memory cells in an I/O block is identified as containing a defect, the address of the column of two-bit memory cells is used to repair the defect. In the presently preferred embodiment, a portion of the address is translated by an address translation circuit and stored in a program/read CAM circuit. Translation of the address provides the location of a repair block in the I/O block that includes the column of two-bit memory cells containing the defect. Storage of the translated address provides the location, as well as allowing for subsequent identification of the column of two-bit memory cells containing the defect during operation of the flash memory.

During operation, the address of columns of two-bit memory cells that are currently being accessed by the flash memory to perform read and write operations are translated. The translated addresses are compared to the translated addresses that were stored during testing. A match indicates that the columns of two-bit memory cells that are currently being accessed by the flash memory contain a defect that has been repaired by the I/O based redundancy.

To effect the repair, the translated address is used to identify and disable access by the flash memory to the repair block in the identified I/O block in the core two-bit memory cell array. In addition, a portion of the address of the columns of two-bit memory cells that are currently being accessed by the flash memory are decoded by a redundant Y-decoder circuit. The redundant Y-decoder circuit decodes a portion of the address to selectively configure a plurality of redundant two-bit memory cells. The redundant two-bit memory cells are selectively configured by the redundant Y-decoder circuit to match the configuration of the repair block. Accordingly, the flash memory performs the read or write operation on the redundant two-bit memory cells in place of the repair block in the identified I/O block.

The presently preferred flash memory uses I/O based redundancy to make repairs in I/O blocks where the bits are non-sequentially numbered as previously discussed. These repairs are possible due to the translated addresses that identify the physical location of the repair blocks irrespective of the non-sequential numbering within the I/O blocks. In addition, the repairs are effected by decoding the addresses of the two-bit memory cells to selectively configure the redundant two-bit memory cells in the redundant two-bit memory cell array to match the repair block identified by the translated addresses.

These and other features and advantages of the invention will become apparent upon consideration of the following detailed description of the presently preferred embodiments of the invention, viewed in conjunction with the appended drawings.

BRIEF DESCRIPTION OF THE DRAWINGS

FIG. 7 is a table representing the logic for the presently preferred address translation circuit illustrated in FIG. 6.

FIG. 14 is a table representing the logic for the presently preferred redundant column select decoder circuit and the presently preferred redundant byte select decoder circuit illustrated in FIGS. 9 and 12.

DETAILED DESCRIPTION

The exemplary embodiments of the present invention are set forth below with reference to specific configurations, and those skilled in the art would recognize that various changes and modifications could be made on the specific configurations while remaining within the scope of the claims. The invention may be used with any type of memory device requiring redundancy; however, the preferred embodiment of the invention is designed for flash memory. All electrical parameters are given by example and can be modified for use with various memory devices using other electrical parameters.

Figure 1:
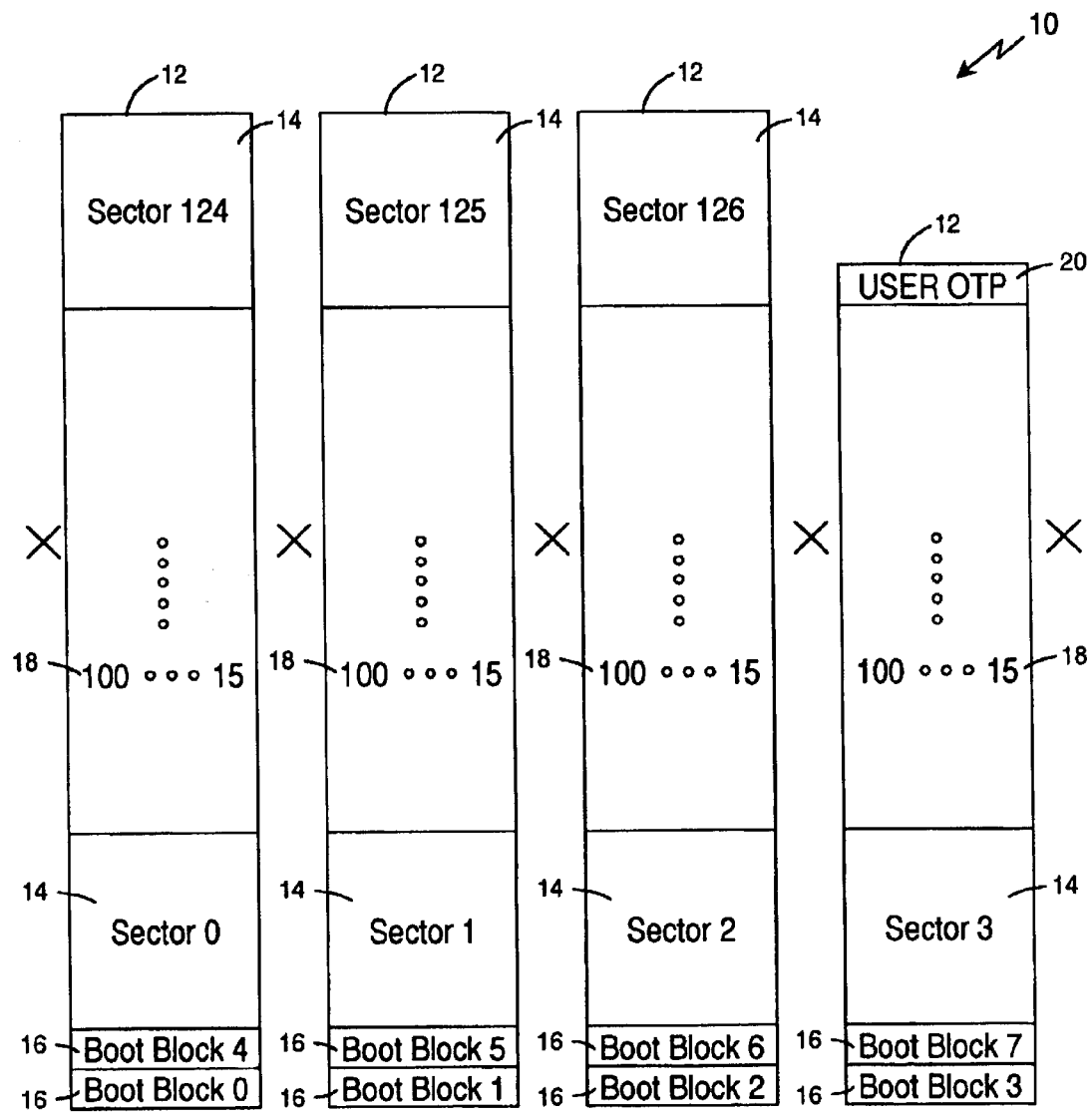
FIG. 1 represents a block diagram of a presently preferred array architecture of the presently preferred flash memory.

The presently preferred embodiments relate to I/O based redundancy in a flash memory containing two-bit memory cells. By way of introduction, a discussion of the configuration and operation of the flash memory is provided to facilitate an understanding of the application of I/O based redundancy. FIG. 1 is a block diagram of the presently preferred flash memory 10 that generally illustrates the organizational layout thereof. The flash memory 10 includes a plurality of redundant blocks 12, a plurality of sectors 14, a plurality of boot blocks 16, a plurality of I/O blocks 18 and a user OTP sector 20.

In the presently preferred embodiment, the flash memory 10 is a 64-megabit machine that has four redundant blocks 12 that each include 32 sectors 14 and 2 boot block sectors 16. Each sector 14 includes 512 Kbits, except for the boot block sectors 16 that each include 64 Kbits. In alternative embodiments, various other memory sizes are possible using various quantities and configurations of the sectors 14, 16 depending on the application of the flash memory 10. A user One Time Programming (OTP) sector 20 provides a data locking function and is advantageously located in one of the redundant blocks 12 as illustrated.

Within each sector 14 and boot block sector 16 there are 16 I/O blocks 18 labeled "I/O 0" through "I/O 15" as illustrated. The presently preferred flash memory 10 operates in 16-bit mode by simultaneously accessing one bit from each of the 16 I/O blocks 18 in a respective sector 14, 16. In alternative embodiments the number of I/O blocks 18 and the corresponding mode can vary, such as, for example a flash memory 10 that includes 8, 32 or 64 I/O blocks 18 operating in 8, 32 or 64-bit mode, respectively. Each bit is a data storage location. In the presently preferred flash memory 10, two-bit flash memory cells are used that are capable of storing two-bits of data in a single memory cell. In alternative preferred embodiments, the memory cells could, for example, be capable of storing 1, 4, 8 or some other number of bits per cell.

Figure 2:
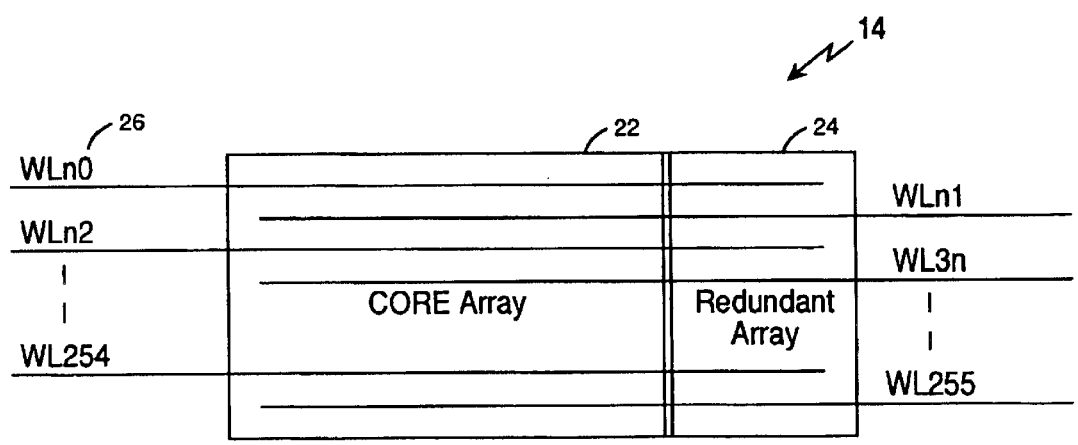
FIG. 2 is a block diagram of a presently preferred sector illustrated in FIG. 1.

FIG. 2 illustrates a block diagram of a sector 14 or a boot block sector 16 illustrated in FIG. 1. The sectors 14 are used during operation of the flash memory 10 and the boot block sectors 16 are used during startup. The presently preferred sectors 14, 16 include a core two-bit memory cell array 22 and a redundant two-bit memory cell array 24. The arrays 22, 24 are created by electrically connecting the two-bit memory cells to form rows and columns. The rows of two-bit memory cells form a plurality of wordlines 26 and the columns of memory cells form a plurality of bitlines that run perpendicular to the wordlines 26 and are hereinafter described.

In the presently preferred embodiment, each of the sectors 14 have 256 wordlines 26 and each of the boot-block sectors 16 have 32 wordlines 26. The wordlines 26 electrically connect the core two-bit memory cell array 22 with the redundant two-bit memory cell array 24. The core two-bit memory cell array 22 in each sector 14, 16 is repaired by the adjacently located redundant two-bit memory cell array 24 using the I/O based redundancy as will be hereinafter described. For the remainder of this discussion, the term sectors 14 will be used to refer to the sectors 14 and the boot-block sectors 16 unless otherwise noted.

Figure 3:
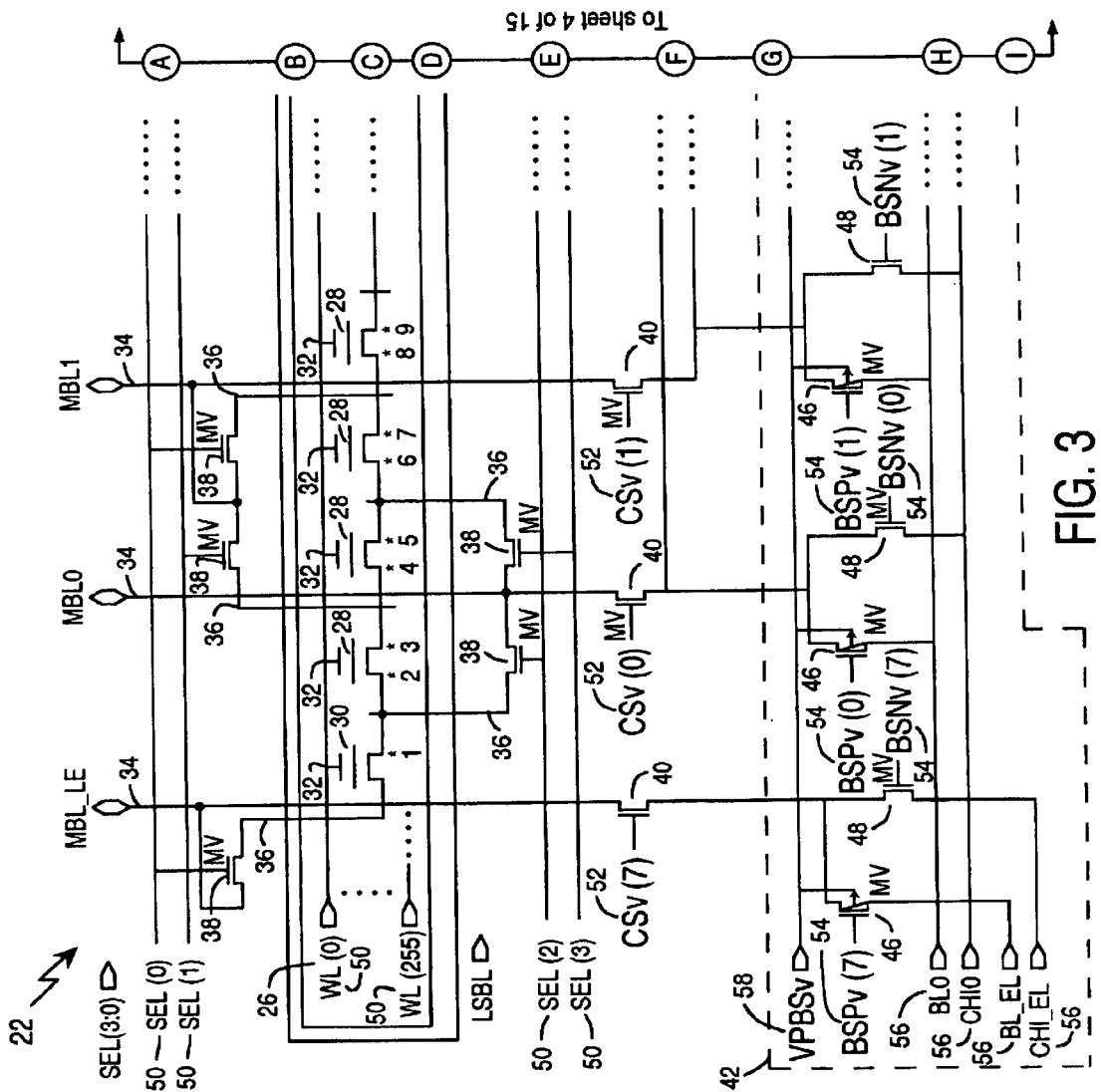
FIG. 3 is a schematic diagram of a portion of a presently preferred core two-bit memory cell array illustrated in FIG. 2.
Figure 3:
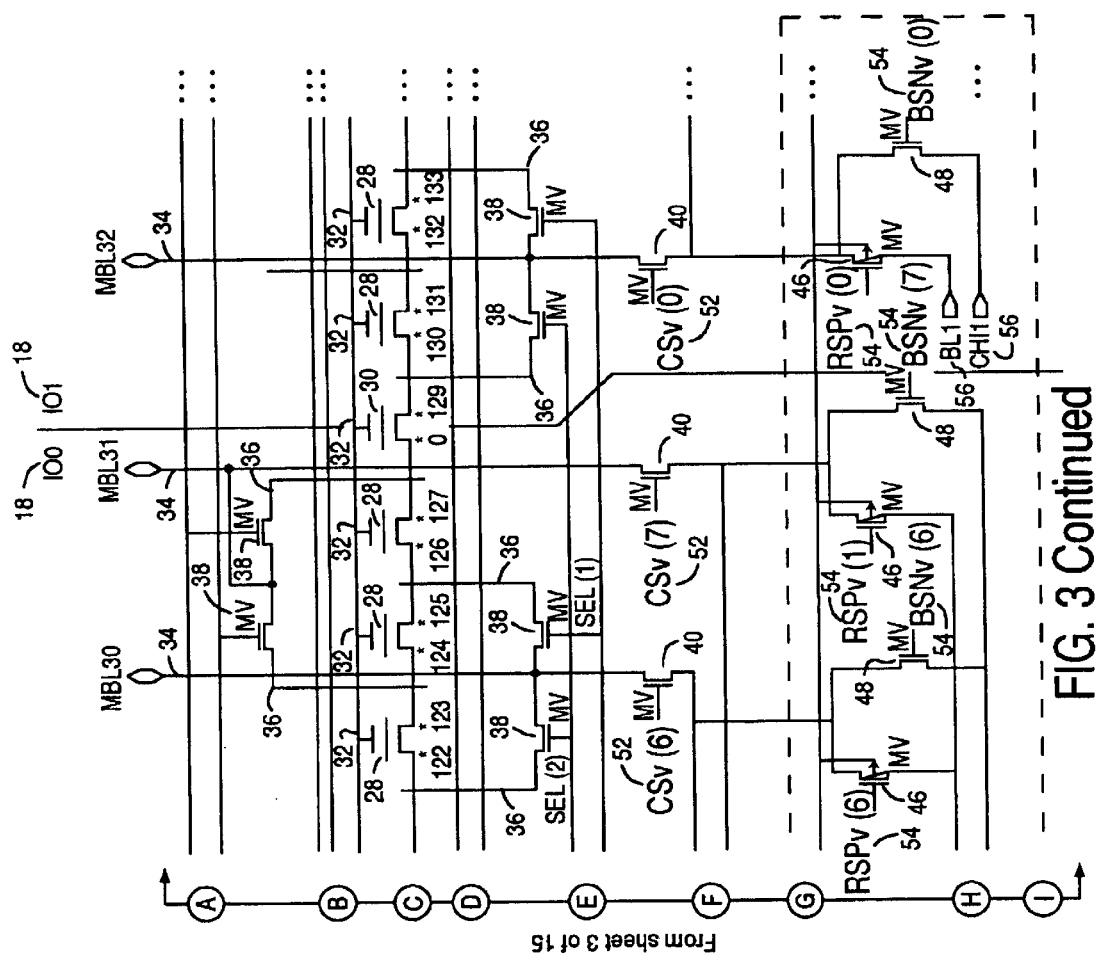

FIG. 3 illustrates a circuit schematic of a portion of the core two-bit memory cell array 22 for the sector 14 illustrated in FIG. 2. The presently preferred core two-bit memory cell array 22 within each of the I/O blocks 18 includes a plurality of two-bit memory cells 28 and a plurality of edge two-bit memory cells 30 forming rows that are the wordlines 26. In addition, the two-bit memory cells 28, 30 form a plurality of columns of two-bit memory cells 32. Each of the presently preferred I/O blocks 18 include 256 wordlines 26 and 64 columns of two-bit memory cells 32. In alternative embodiments, additional or fewer wordlines 26 and columns of two-bit memory cells 32 are possible.

Each of the I/O blocks 18 within the sectors 14 also includes a plurality of metal2 bitlines 34, a plurality of metal1 bitlines 36, a plurality of metal1 sector select transistors 38, a plurality of metal2 bitline select transistors 40 and a Y-select circuit 42. The columns of two-bit memory cells 32 within each I/O block 18 are electrically connected with the metal2 bitlines 34, the metal1 bitlines 36, the metal1 sector select transistors 38, the metal2 bitline select transistors 40 and the Y-select circuit 42 as shown in FIG. 3. The Y-select circuit 42 includes a plurality of p-channel transistors 46 and a plurality of n-channel transistors 48 electrically connected as illustrated.

In the presently preferred embodiment, there are 64 metal1 bitlines 36 per I/O block 18 that are electrically connected to 32 respective metal2 bitlines 34. In one of the wordlines 26 in each of the I/O blocks 18 in the core two-bit memory cell array 22, there are 128 bits located in 64 two-bit memory cells 32. A bit identified as a zero bit ("*0" in the I/O block 18 identified as "IO0" of FIG. 3) is located on the right edge of each of the presently preferred I/O blocks 18 within one of the edge two-bit memory cells 30. The remaining 127 bits are not sequentially configured within the I/O blocks 18. Instead, the remaining 127 bits ("*1" through "*127" in FIG. 3) are number consecutively from the left edge of the I/O block 18 toward the zero bit ("*0"). In alternative embodiments, the non-sequential configuration of the core two-bit memory cell array 22 may be arranged differently to facilitate efficient operation of the I/O blocks 18.

A bit identified as a one bit ("*1" in the I/O block 18 identified as "IO0" of FIG. 3) is within another of the edge two-bit memory cells 30. The edge two-bit memory cells 30 are located in each wordline 26 along the left and right edges of each of the sectors 14. The presently preferred edge two-bit memory cells 30 are operable to store only one bit for the respective I/O block 18. Unless otherwise noted, for the remainder of this discussion, the term two-bit memory cells 28 will be used to refer to both the two-bit memory cells 28 and the edge two-bit memory cells 30.

Activation of the two-bit memory cells 28 allows data to be read from, or written to, the bits within the two-bit memory cells 28. The bits within the two-bit memory cells 28 are read and written by activating respective metal1 sector select transistors 38, metal2 bitline select transistors 40 and the Y-select-circuit 42. The sector select transistors 38 and the metal2 bitline select transistors 40 are activated by predetermined voltages on a plurality of sector select lines (SEL) 50 and a plurality of column select lines (CSv) 52, respectively.

The Y-select circuit 42 selectively supplies predetermined voltages to the left and right regions of the respective two-bit memory cells 28. The predetermined voltages are supplied based on activation of the byte select lines (BSPv, BSNv) 54. The predetermined voltages are selectively supplied on the voltage supply lines (BL, CMI) 56 to erase and program a respective bit in one direction and read a bit in the opposite direction. A power supply line (VPBSv) 58 supplies a predetermined voltage to prevent reverse bias of the p-channel transistors 46. In the presently preferred embodiment, the power supply line (VPBSv) 58 provides a supply voltage Vcc in a range of about 2.7 to 3.6 volts during reading of the two-bit memory cells 28. In addition, a drain voltage in the range of about 5 to 6 volts is supplied during programming and erasing of the two-bit memory cells 28.

During operation, the flash memory 10 selectively activates the two-bit memory cells 28 based on addresses. The addresses include identification of the redundant block 12, the sector 14, the metal2 bitlines 34 and the wordline 26 that correspond to the particular two-bit memory cells 28. Selective activation by the flash memory 10 allows data to be read from or written to the two-bit memory cells 28. As will be hereinafter described, activation of the two-bit memory cells 28 also provides partial activation of the redundant two-bit memory cell array 24.

Figure 4:
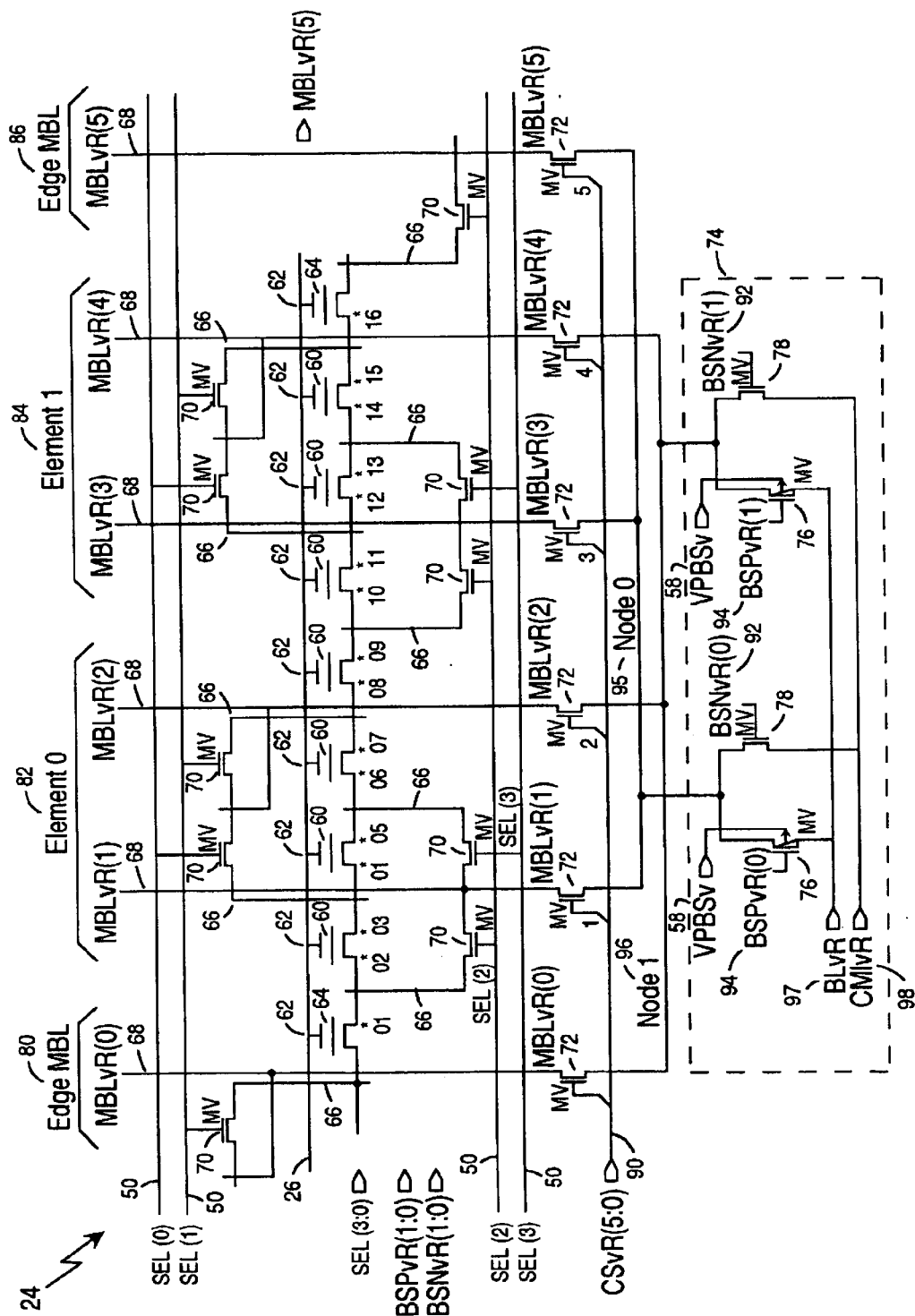
FIG. 4 is a schematic diagram of a portion of a presently preferred redundant two-bit memory cell array illustrated in FIG. 2.

FIG. 4 is a circuit schematic of the redundant two-bit memory cell array 24 illustrated in FIG. 2. The presently preferred redundant two-bit memory cell array 24 includes a plurality of redundant two-bit memory cells 60 formed into redundant columns of two-bit memory cells 62 within each respective sector 14. In addition, a plurality of redundant edge two-bit memory cells 64 are also formed into redundant columns of two-bit memory cells 62. Similar to the columns of two-bit memory cells 32 in FIG. 3, the redundant columns of two-bit memory cells 62 are electrically connected with a plurality of metal1 redundant bitlines 66, a plurality of metal2 redundant bitlines 68, a plurality of redundant metal1 sector select transistors 70, a plurality of redundant metal2 bitline select transistors 72 and a redundant Y-select circuit 74 as illustrated.

The redundant Y-select circuit 74 includes a plurality of p-channel transistors 76 and a plurality of n-channel transistors 78 that are electrically connected as illustrated. In addition, the Y-select circuit 74 is electrically connected with the power supply line (VPBSv) 58 to prevent reverse bias of the p-channel transistors 76.

In the presently preferred flash memory 10, the redundant columns of two-bit memory cells 62 are divided into a first edge MBL 80, a redundant element zero 82, a redundant element one 84 and a second edge MBL 86. The first and second edge MBLs 80, 86 each include one metal2 redundant bitline 68 identified as "MBLvR(0)" and "MBLvR(5)" respectively in FIG. 4. The redundant element zero 82 includes two metal2 redundant bitlines 68 identified as "MBLvR(1)" and "MBLvR(2)." Similarly, the redundant element one 84 includes two metal2 redundant bitlines 68 identified as "MBLvR(3)" and "MBLvR(4)." Each of first and second edge MBLs 80,86 include one of the redundant edge two-bit memory cells 64 in each wordline 26.

The redundant elements 82,84 each include five of the redundant two-bit memory cells 60 in each wordline 26. As illustrated in FIG. 4, the redundant element zero 82 includes the redundant edge two-bit memory cell 64 with the bit identified as "*1" and the redundant two-bit memory cells 60 identified as "*2", "*3", "*4", "*5", "*6", "*7" and "*8." Similarly, the redundant element one 84 includes the redundant two-bit memory cells with bits identified as "*9", "*10", "*11", "*12", "*13", "*14", "*15" and the redundant edge two-bit memory cell 64 with the bit identified as "*16."

Each sector 14 in the presently preferred redundant two-bit memory cell array 24 comprises 7 redundant two-bit memory cells 60 and 2 redundant edge two-bit memory cells 64 in each wordline 26. The redundant two-bit memory cells 60,64 are electrically connected to 10 metal1 redundant bitlines 66 and 6 metal2 redundant bitlines 68 as illustrated. In an alternative preferred embodiment, the numbers of redundant two-bit memory cells 60 and associated bitlines can be increased or decreased to facilitate larger or smaller repairs within the sectors 14.

Repairs within the I/O blocks 18 within each sector 14 are performed using the redundant elements zero and one 82,84. In addition, the first and second edge MBLs 80,86 are used with the redundant elements zero and one 82,84. Each of the presently preferred redundant elements zero and one 82,84 are capable of repairing five columns of two-bit memory cells 32 in a particular I/O block 18.

Repair of five columns of two-bit memory cells 32 electrically replaces 3 of the two-bit memory cells 28 in a particular wordline 26 completely. In addition, 2 of the two-bit memory cells 28 in the particular wordline 26 each have one bit replaced. For example, referring again to FIG. 3, if the column of two-bit memory cells 32 that is identified as defective contains the bits identified as "*2" and "*3", the bits identified as "*1", "*2", "*3", "*4", "*5", "*6", "*7" and "*8" are electrically replaced by the repair. Similarly, if the column of two-bit memory cells 32 that is identified as defective contains the bits identified as "*122" and "*123", the bits identified as "*121" (not shown), "*122", "*123", "*124", "*125", "*126", "*127" and "*0" are electrically replaced by the repair. Two repairs can be performed in the I/O blocks 18 of each of the sectors 14 using the redundant two-bit memory cell array 24 associated with that sector 14.

Referring again to FIG. 4, the redundant metal2 bitline select transistors 72 are selectively activated using a plurality of redundant column select lines (CSvR) 90 similar to the Y-select circuit 42 of the core two-bit memory cell array 22. In the presently preferred embodiment, there are 6 redundant column select lines (CSvR) 90 that correspond to the metal2 redundant bitlines 68. The redundant Y-select circuit 74 is selectively activated using a plurality of redundant N byte select lines (BSNvR) 92 and a plurality of redundant P byte select lines (BSPvR) 94.

Signals on the redundant N byte select lines (BSNvR) 92 control the respective n-channel transistors 78 and signals on the redundant P byte select lines (BSPvR) 94 control the respective p-channel transistors 76. The redundant byte select lines (BSNvR, BSPvR) 92, 94 are identified with a "0" or "1," as illustrated in FIG. 4. The "0" identification designates control of the voltage supplied to a node zero 95. The node zero 95 is electrically connected with the metal2 redundant bitlines 68 identified as "MBLvR1", "MBLvR3" and "MBLvR5" in FIG. 4. Similarly, the "1" identification designates control of voltage supplied to a node one 96. The node one 96 is electrically connected with the metal2 redundant bitlines 68 identified as "MBLvR0", "MBLvR2" and "MBLvR4."

The redundant two-bit memory cells 60, 64 are selectively supplied voltage on either a redundant BL voltage line (BLvR) 97 or a redundant CMI voltage line (CMIvR) 98. Application of the voltages from the redundant BL voltage line (BLvR) 97 and the redundant CMI voltage line (CMIvR) 98 to the left and right regions of particular redundant two-bit memory cells 60, 64 allows them to be read and written as previously set forth. The sector select lines (SEL) 50 and the wordlines 26 are common to the core two-bit memory cell array 22 and the redundant two-bit memory cell array 24, as previously discussed.

During operation, selection of the redundant metal2 bitlines 68 corresponds to one of the 8 bits that would be activated in the event of a repair. The redundant metal2 bitlines 68 that supply voltage to the left and right regions of a particular redundant two-bit memory cell 60, 64 are selected based on a portion of the address. As previously discussed, 8 bits are repaired in a particular I/O block 18 in the core two-bit memory cell array 22. However, only 1 of the 8 bits in a particular I/O block 18 is activated by the address. Accordingly, the redundant metal2 bitlines 68 that are operable to activate the corresponding bit within the redundant two-bit memory cell 60, 64 are selected to facilitate repairs using the I/O based redundancy.

Figure 5:
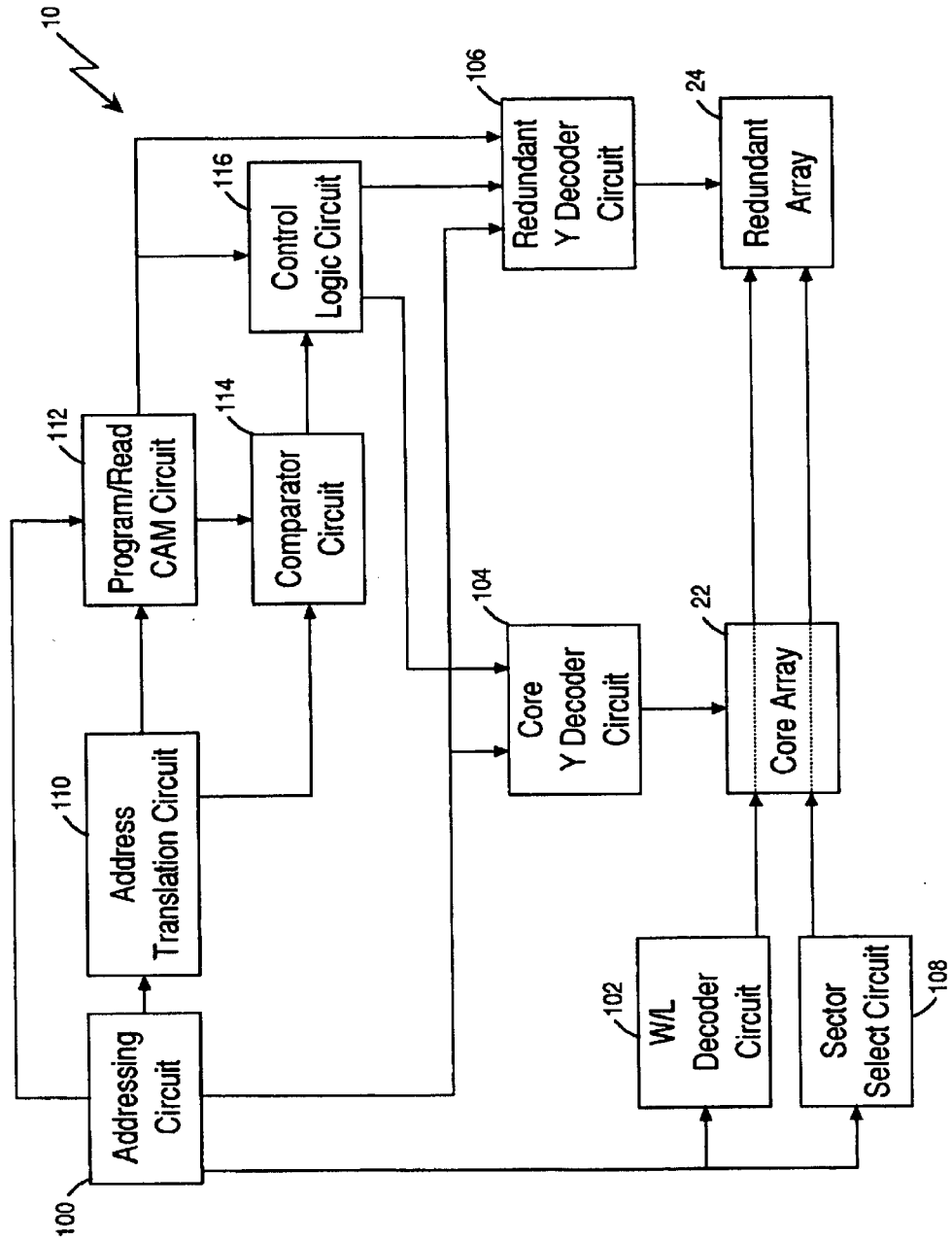
FIG. 5 is a block diagram of a portion of a presently preferred flash memory incorporating the presently preferred I/O-based redundancy.

FIG. 5 is a block diagram of a portion of the flash memory 10 that illustrates the I/O based redundancy of the presently preferred embodiment. The I/O based redundancy includes the core two-bit memory cell array 22, the redundant two-bit memory cell array 24, an addressing circuit 100, a wordline decoder circuit 102, a core Y-decoder circuit 104, a redundant Y-decoder circuit 106 and a sector select circuit 108. In addition, the I/O based redundancy includes an address translation circuit 110, a program/read CAM circuit 112, a comparator circuit 114 and a control logic circuit 116. The circuits included in the I/O based redundancy are electrically connected as illustrated. The I/O based redundancy is operable to selectively replace the columns of two-bit memory cells 32 that are defective with the redundant columns of two-bit memory cells 62.

Referring now to FIGS. 3, 4 and 5, the presently preferred addressing circuit 100 is operable to generate the addresses that identify two-bit memory cells 28 during operation of the flash memory 10. The identified two-bit memory cells 28 are activated to be read or written. The addressing circuit 100 can be any circuit capable of receiving instructions from the flash memory 10 and generating addresses. A part of each address is decoded by the wordline decoder circuit 102 to identify and activate one of the wordlines 26.

The address is also decoded by the core Y-decoder circuit 104 and the redundant Y-decoder circuit 106. The core Y-decoder circuit 104 is operable to selectively activate the metal2 bitline select transistors 40 and the Y-select circuit 42, based on the address. Similarly, the redundant Y-decoder circuit 106 selectively activates the redundant metal2 bitline select transistors 72 and the redundant Y-select circuit 74. However, to facilitate possible repairs, decoding by the redundant Y-select circuit 74 activates portions of the redundant two-bit core cell array 24 to match the configuration of a portion of the core two-bit memory cell array 22 as will be hereinafter described in detail. The sector select circuit 108 decodes the address to simultaneously control activation of the metal1 sector select transistors 38 and the redundant metal1 sector select transistors 70.

The presently preferred address translation circuit 110 receives a portion of the address from the addressing circuit 100. The address translation circuit 110 is operable to decode and translate a portion of each of the addresses. The addresses are translated to identify the location of a repair block containing two-bit memory cells 28 within an I/O block 18 of the core two-bit memory cell array 22. The repair blocks of the presently preferred embodiment includes 2 metal2 bitlines 34 and groups of 5 of the two-bit memory cells 28 representing 8 bits. The 2 metal2 bitlines 34 that are identified as part of the repair block supply voltages to the left and right regions of the particular two-bit memory cell 32 that is activated by the particular address.

Translation is required due to the location of the zero bit on the right edge of the I/O block 18 as previously discussed with reference to FIG. 3. In alternative preferred embodiments, other non-sequential addressing with respect to the physical location of the bits in the core two-bit memory cell array 22 is possible. Translation of a portion of each of the addresses provides a translated address that identifies a corresponding repair block in the I/O blocks 18.

During operation of the flash memory 10, the address translation circuit 110 translates each address generated by the addressing circuit 100. Similarly, during a test mode where columns of two-bit memory cells 32 that are defective are identified, the corresponding address is translated. Once the address of a column of two-bit memory cells 32 that are defective is identified, the address translation circuit 110 translates the address to identify the location of the respective repair block. The translated address can then be stored in the program/read CAM circuit 112.

The presently preferred program/read CAM circuit 112 is a traditional address storage circuit comprising a plurality of CAM cells. CAM cells are well known storage devices each capable of storing and reading one bit. In the presently preferred embodiment, the program/read CAM circuit 112 is operable to store the translated addresses during the test mode.

During the test mode, columns of two-bit memory cells 32 that are defective are identified. Once the address of a column of two-bit memory cells 32 that are defective is identified, a portion of the address is translated by the address translation circuit 110 and stored in storage locations that are the CAM cells. The storage locations within the program/read CAM circuit 112 correspond to one of the redundant elements 82, 84 and to a particular one of the redundant blocks 12. In addition, the identification of the I/O block 18 that includes the column of two-bit memory cells 32 that contains the defect is stored in the CAM cells to correspond to the translated address. Accordingly, translated addresses stored in a particular storage location identify the redundant element 82, 84 as well as the corresponding redundant block 12 and the I/O block 18 where the column of two-bit memory cells 32 that are defective is located.

The program/read CAM circuit 112 is also operable to read translated addresses previously stored therein during operation of the flash memory 10. The translated addresses that are read from the program/read CAM circuit 112 correspond to the redundant block 12 identified by the address currently being supplied by the addressing circuit 100. The identification of the redundant block 12 is provided to the program/read CAM circuit 112 by the addressing circuit 100. Translated addresses read out of the program/read CAM circuit 112 are provided to the comparator circuit 114.

The comparator circuit 114 can be any circuit capable of comparing two sets of values and providing an output when a match occurs. The presently preferred comparator circuit 114 is operable to receive and compare previously stored translated addresses to a translated address provided from the address translation circuit 110. The translated address from the address translation circuit 110 represents a repair block that corresponds to the address currently being provided by the addressing circuit 100 to the wordline decoder circuit 102, the Y-decoder circuits 104, 106 and the sector select circuit 108.

The address from the addressing circuit 100 selectively activates the core two-bit memory cell array 22 and the redundant two-bit memory cell array 24 as previously set forth. The columns of two-bit memory cells 32 that correspond to the address currently provided by the addressing circuit 100 are referred to as the columns of two-bit memory cells 32 that are active. If the translated address of one of the columns of memory cells 32 that are active matches one of the previously stored translated addresses, the control logic circuit 116 is activated by the comparator circuit 114.

The presently preferred control logic circuit 116 operates to electrically exchange columns of redundant two-bit memory cells 62 with columns of two-bit memory cells 32 that include a defect. When activated, the control logic circuit 116 effectively disables the columns of two-bit memory cells 32 that include a defect and enables columns of redundant two-bit memory cells 62 to replace them. The replacement is based on the previously stored translated address. In addition, the replacement is based on the storage location of the translated address in the program/read CAM circuit 112 that identifies the I/O block 18 and the redundant element 82, 84.

During programming and erasing of the columns of two-bit memory cells 32 that include a defect, the control logic circuit 116 controls both the core Y-decoder circuit 104 and the redundant Y-decoder circuit 106 to perform an electrical exchange. In the presently preferred embodiment, the electrical exchange occurs in one of the I/O blocks 18 within all the sectors 14 of a particular redundant block 12. In other words, the columns of two-bit memory cells 32 within the particular redundant block 12 are repaired in all the sectors 14 in that redundant block 12.

During reading of the columns of two-bit memory cells 32 that include a defect that has been identified, the control logic circuit 116 deactivates a sensing amp. The sensing amp is associated with the I/O block 18 that includes the columns of two-bit memory cells 32 that include the defect. In addition, the control logic circuit 116 activates a sensing amp associated with the redundant columns of two-bit memory cells 62. In the presently preferred embodiment, only one redundant element 80,82 is activated at a time, therefore only one sensing amp is required for I/O based redundancy in the flash memory 10. The sensing amp is operable to read the redundant two-bit memory cell array 24 within each sector 14 of the flash memory 10.

The presently preferred flash memory 10 includes I/O based redundancy that allows electrical repair of the core two-bit memory cell array 22. Although the core two-bit memory cell array 22 is designed with non-sequentially configured columns of two-bit memory cells 32, the I/O based redundancy can identify the location of a defect and perform repairs. This is accomplished by translating the addresses used to access the two-bit memory cells 28 in the core two-bit memory cell array 22.

Translation of the addresses provides repair block locations within each I/O block 18 that can be stored and then compared against the translated address of a column of two-bit memory cells 32 that is active. In addition, the address of a column of two-bit memory cells 32 that is active is decoded to selectively activate a configuration of the redundant columns of two-bit memory cells 32. The configuration of the redundant columns of two-bit memory cells 32 matches the configuration of the two-bit memory cells 28 in the core two-bit memory cell array 22 whose location has been identified by the translated address.

Figure 6:
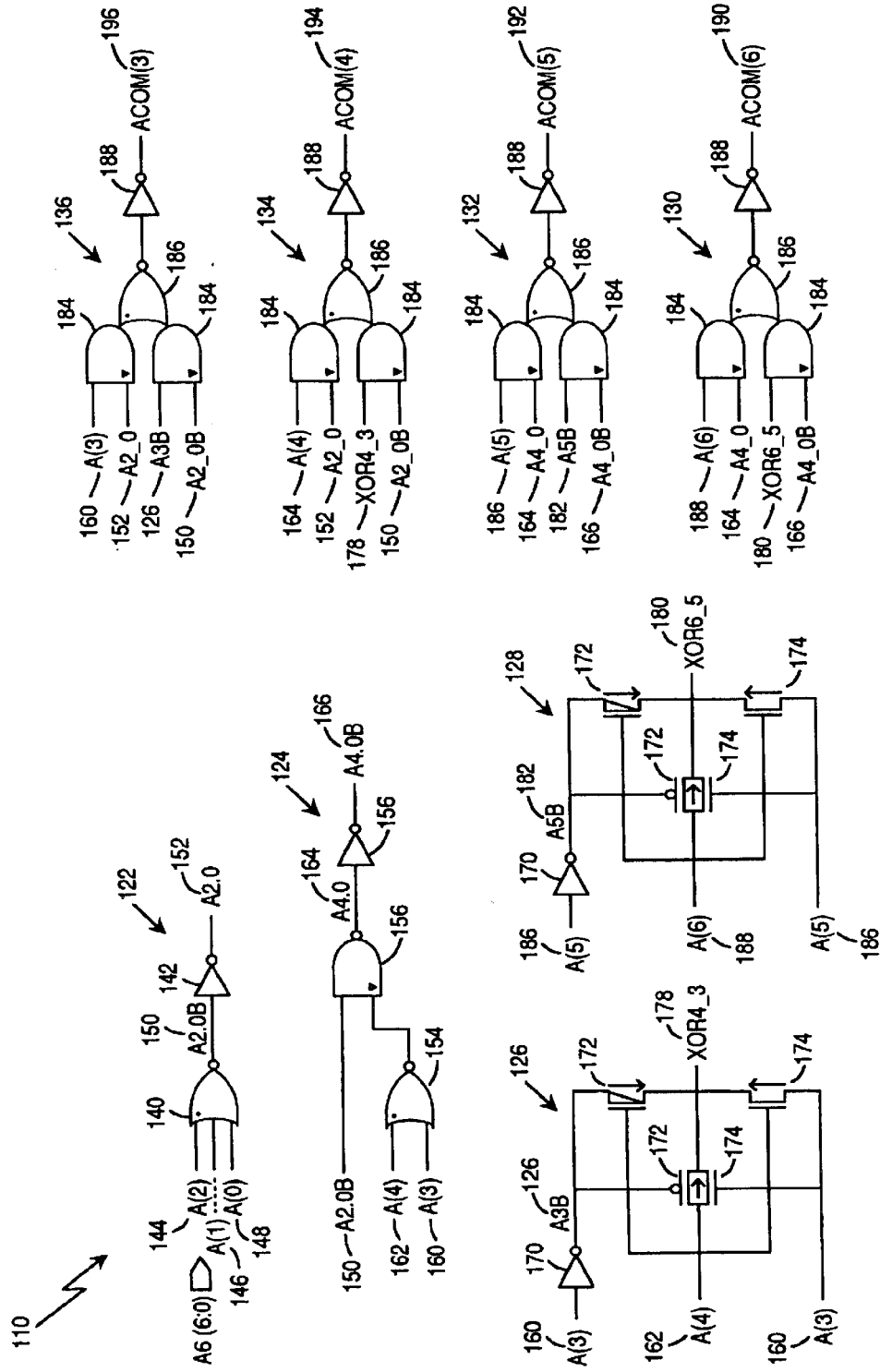
FIG. 6 is a schematic diagram of a presently preferred address translation circuit illustrated in FIG. 5.

FIG. 6 is a circuit schematic of the address translation circuit 110 illustrated in the block diagram of FIG. 5. The presently preferred address translation circuit 110 includes a first OR circuit 122, a second OR circuit 124, a first FOR circuit 126, a second XNOR circuit 128, a first logic circuit 130, a second logic circuit 132, a third logic circuit 134 and a fourth logic circuit 136. As previously set forth, the address translation circuit 110 is operable to translate a portion of addresses to generate translated addresses.

In the presently preferred embodiment, the portion of the addresses received by the address translation circuit comprise 7 bits. The bits of the addresses can be identified as A(0)–A(6) where A(0) represents the least significant bit and A(6) represents the most significant bit. The bits of the addresses A(0)–A(6) are used by address translation circuit 110 to generate the translated addresses.

A portion of the 7 bits are received by the first OR circuit 122. The first OR circuit 122 comprises a NOR gate 140 and an inverter 142 electrically connected as illustrated. The portion of the address received by the NOR gate 140 is A(0) provided on an A(0) line 144, A(1) provided on an A(1) line 146 and A(2) provided on an A(2) line 148. The output of the NOR gate 140 is provide on an A2_0B line 150 and the output of the inverter 142 is provided on an A2_0 line 152. The A2_0B line 150 is electrically connected with the second OR circuit 124.

The second OR circuit 124 includes a NOR gate 154, a NAND gate 156 and an inverter 158 electrically connected as illustrated. The NAND gate 156 also receives a portion of the 7-bits of the address, namely A(3) on an A(3) line 160 and A(4) on an A(4) line 162. The output of the NAND gate 156 is provided on an A4_0 line 164 and the output of the inverter is provided on an A4_0B line 166.

The first and second XNOR circuits 126, 128 each include an inverter 170, a plurality of p-channel transistors 172 and a plurality of n-channel transistors 174 electrically connected as illustrated. The first XNOR circuit 126 receives the A(3) and A(4) bits on the respective A(3) and A(4) lines 160, 162. The output of the inverter 170 in the first XNOR circuit 126 is provided on an A3B line 176 and the output of the first XNOR circuit 126 is provided on a XOR4_3 line 178. The output of the second XNOR circuit 128 is provided on a XOR6_5 line 180. The output of the inverter 170 within the second XNOR circuit 128 is provided on an A5B line 182.

The bits of the address and the outputs from the first OR circuit 122, the second OR circuit 124, the first XNOR circuit 126 and the second XNOR circuit 128 are provided as inputs to the logic circuits 130, 132, 134, 136. The logic circuits 130, 132, 134, 136 each include a plurality of AND gates 184, a NOR gate 186 and an inverter 188 that are electrically connected as illustrated in FIG. 6. The respective logic circuits 130, 132, 134, 136 generate outputs on an ACOM(6) line 190, an ACOM(5) line 192, an ACOM(4) line 194 and an ACOM(3) line 196, respectively, based on the inputs provided thereto.

FIG. 7 is a table illustrating the logic associated with the presently preferred address translation circuit 110. The table includes a replaced MBL column 200 that illustrates the result of the translation of the portion of the address by the address translation circuit 110. In other words, the replace MBL column 200 identifies the repair block within a particular corresponding I/O block 18. Identification of the repair block is based on identification of two corresponding metal2 bitlines 34 in the core two-bit memory cell array 22 as best illustrated in FIG. 3. The remaining columns in the table of FIG. 7 represent the logic states of selected lines within the first and second OR circuits 122,124, the first and second XNOR circuit 126, 128 and the logic circuits 130, 132, 134, 136. For the ACOM lines 190, 192, 194, 196 the shading in each row represents the logic states.

Referring now to FIGS. 3, 6 and 7, the operation of the address translation circuit 110 will be explained. When the addressing circuit 100 generates an address, the first 7 bits (A0–A6) are provided to the address translation circuit 110. The address translation circuit 110 performs logic operations to generate a translated address represented by the signals on the ACOM lines 190, 192, 194, 196 best illustrated in FIG. 6. Referring now to FIG. 7, the translated addresses are represented as the shaded values in the rows of the table. The translated addresses refer to a repair block in an I/O block 18. The particular repair block identified by the translated address includes the metal2 bitlines 34 identified in the replace MBL column 200.

For example, assume the two-bit memory cell 28 that includes bit 4 ("*4") as illustrated in FIG. 3 is being accessed by the address generated by the addressing circuit 100. In this case, the address translation circuit 110 would translate a portion of the address to identify the translated address as 0000. The translated address would be represented by logic low signals on the ACOM lines 190, 192, 194, 196. The translated address would identify the repair block to include the metal2 bitlines 34 identified as 0,1 in the replaced MBL column 200 of FIG. 7. The metal2 bitlines 34 identified as 0,1 in the replaced MBL column 200 correspond to the metal2 bitlines 34 identified as "MBL0" and "MBL1" in the I/O block 18 identified as "100" in FIG. 3. Correspondingly, bits 1 thru 8 of I/O block 18 identified as "I/O 0" as illustrated in FIG. 3 would form the repair block. The reader should note that the repair block may be located in a similar location in other I/O blocks 18 within the sector 14 depending on the I/O block 18 stored during testing to correspond to the translated address. During identification of the repair block in one of the I/O blocks 18, the redundant Y-decoder circuit 106 selectively activates corresponding portions of the redundant two-bit memory cell array 24 as described below.

Figure 8:
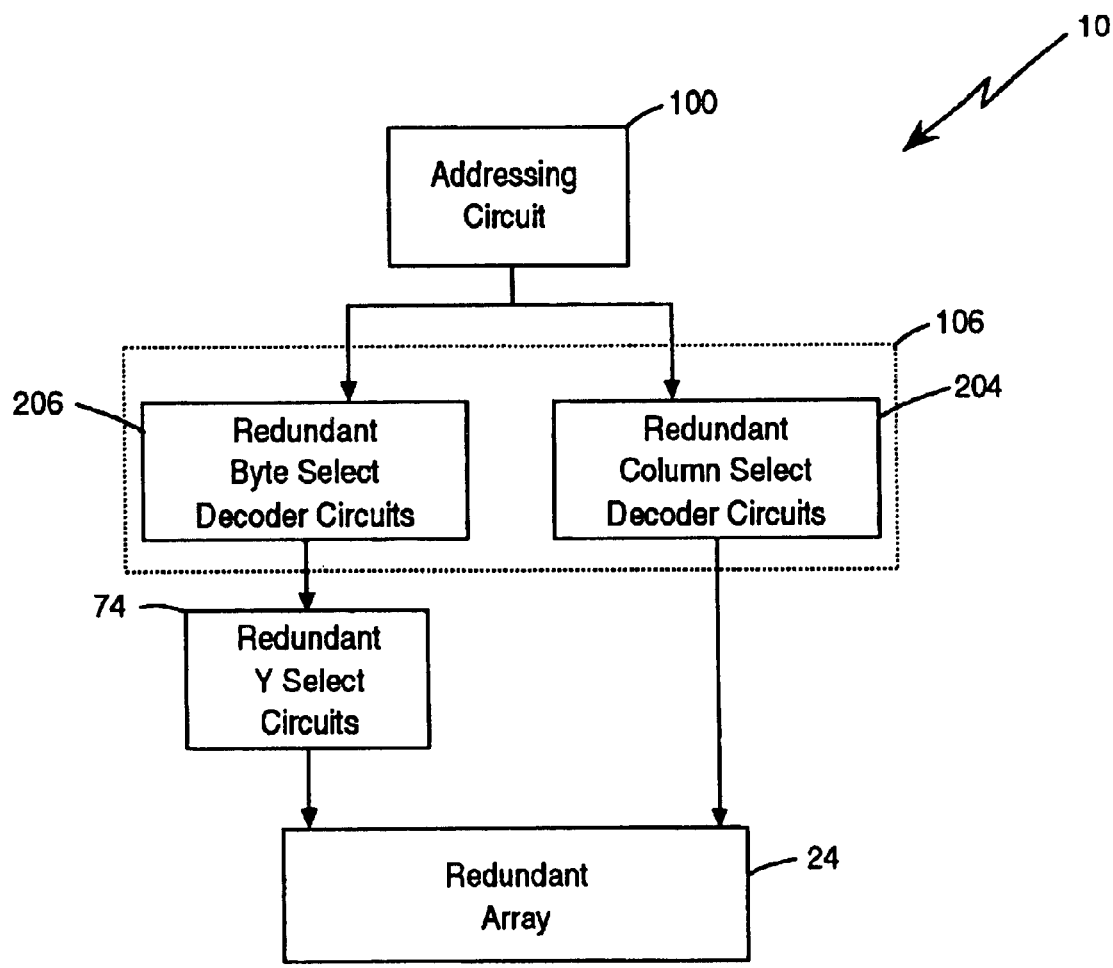
FIG. 8 is an expanded block diagram of a portion of the presently preferred flash memory illustrated in FIG. 1.

FIG. 8 is an expanded block diagram of a portion of the flash memory 10 illustrated in FIG. 5. Specifically, FIG. 8 includes the addressing circuit 100, the redundant two-bit memory cell array 24, the redundant Y-select circuits 74 and an expanded block diagram of the redundant Y-decoder circuit 106. The presently preferred redundant Y-decoder circuit 106 includes a plurality of redundant column select decoder circuits 204 and a plurality of redundant byte select decoder circuits 206 electrically connected as illustrated. The redundant Y-decoder circuit 106 operates to decode a portion of the addresses from the addressing circuit 100 to selectively activate the redundant two-bit memory cell array 24.

Referring now to FIGS. 4 and 8, selective activation of the redundant two-bit memory cell array 24 involves activation of the redundant elements 82, 84. As previously set forth with reference to FIG. 4, the sector select lines (SEL) 50 and the wordlines 26 are activated simultaneously with the core two-bit memory cell array 22. Therefore, the selective activation of the redundant elements 82, 84 by the redundant Y-decoder circuit 106 involves selective activation of the column select lines (CSvR) 90 and the Y-select circuit 74. Selective activation of the column select lines (CSvR) 90 and the Y-select circuit 74 is accomplished with the redundant column select decoder circuits 204 and the redundant byte select decoder circuits 206, respectively. In the presently preferred embodiment, there is one redundant column select decoder circuit 204 and one redundant byte select decoder circuit 206 within each of the redundant blocks 12.

Figure 9:
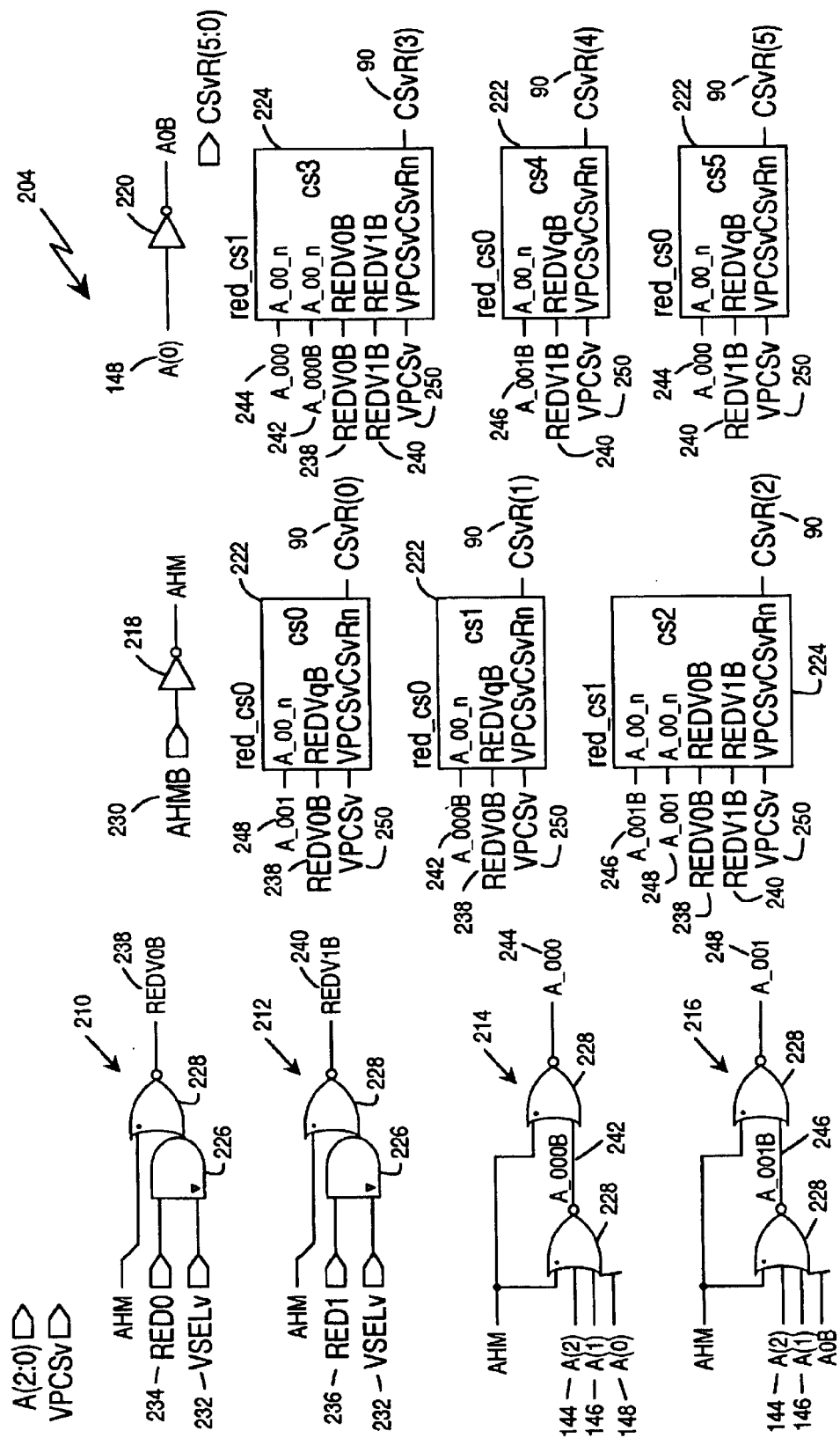
FIG. 9 is a schematic diagram of a presently preferred redundant column select decoder circuit illustrated in FIG. 8.

FIG. 9 is a circuit schematic of the presently preferred redundant column select decoder circuit 204 illustrated in FIG. 8. The redundant column select decoder circuit 204 includes a first logic circuit 210, a second logic circuit 212, a third logic circuit 214, a forth logic circuit 216, a first inverter 218 and a second inverter 220 that are electrically connected as illustrated. In addition, the redundant column select circuit 204 includes a plurality of first redundant column select circuits (red_cs0) 222 and a plurality of second redundant column select circuits (red_cs1) 224. The logic circuits 210, 212, 214, 216 include a plurality of AND gates 226 and a plurality of NOR gates 228 that are electrically connected as illustrated.

The first and second logic circuits 210, 212 receive the inverted signal present on a stress mode line (AHMB) 230 as well as the signal present on a vertical select line (VSELv) 232. The stress mode line (AHMB) 230 provides an active low stress mode signal used for stress mode testing of the flash memory 10. The stress mode signal remains in a logic high state during operation. The vertical select line (VSELv) 232 provides a logic high signal when the redundant block 12 associated with the respective redundant column select decoder circuit 204 is active. The identification of the redundant block 12 is provided by the addressing circuit 100.

The first logic circuit 210 also receives a signal on a redundant zero line (RED0) 234 that is logic high to indicate when the redundant element zero 82 is selected. Similarly, the second logic circuit 212 receives a signal on a redundant one line (RED1) 236 that is logic high to indicate when the redundant element one 84 is selected. Selection of the redundant elements 82, 84 corresponds to the storage locations in the program/read CAM circuit 112 as previously discussed. The outputs from the first and second logic circuits 210, 212 are supplied on a redundant value zero line (REDV0B) 238 and a redundant value one line (REDV1B) 240, respectively.

The third and forth logic circuits 214, 216 similarly receive the inverted signal present on the stress mode line (AHMB) 230. In addition, signals representing the bits A(0), A(1) and A(2) from the addressing circuit 100 are received on the A(0) line 148, the A(1) line 146 and the A(2) line 148, respectively, as illustrated in FIG. 9. The outputs from the NOR gates 228 of the third logic circuit 214 are provided on a third logic B line (A_000B) 242 and a third logic line (A_000) 244. Similarly, the outputs of the NOR gates 228 of the fourth logic circuit 216 are provided on a fourth logic B line (A_001B) 246 and a fourth logic line (A_001) 248.

The outputs from the logic circuits 210, 212, 214, 216 are provided to the first redundant column select circuits (red_cs0) 222 and the second redundant column select circuits (red_cs1) 224 as illustrated. In addition, a VPCSv power supply line 250 supplies a voltage to the first redundant column select circuits (red_cs0) 222 and the second redundant column select circuits (red_cs1) 224. The presently preferred voltage on the VPCSv power supply line 250 is supplied by a variable power supply that is the supply voltage Vcc during reading and 9 volts during programming and erasing of the flash memory 10. The output of the first redundant column select circuits (red_cs0) 222 and the second redundant column select circuits (red_cs1) 224 are supplied on each of the redundant column select lines (CSvR) 90 (zero through five) as previously discussed with respect to FIG. 4.

Figure 10:
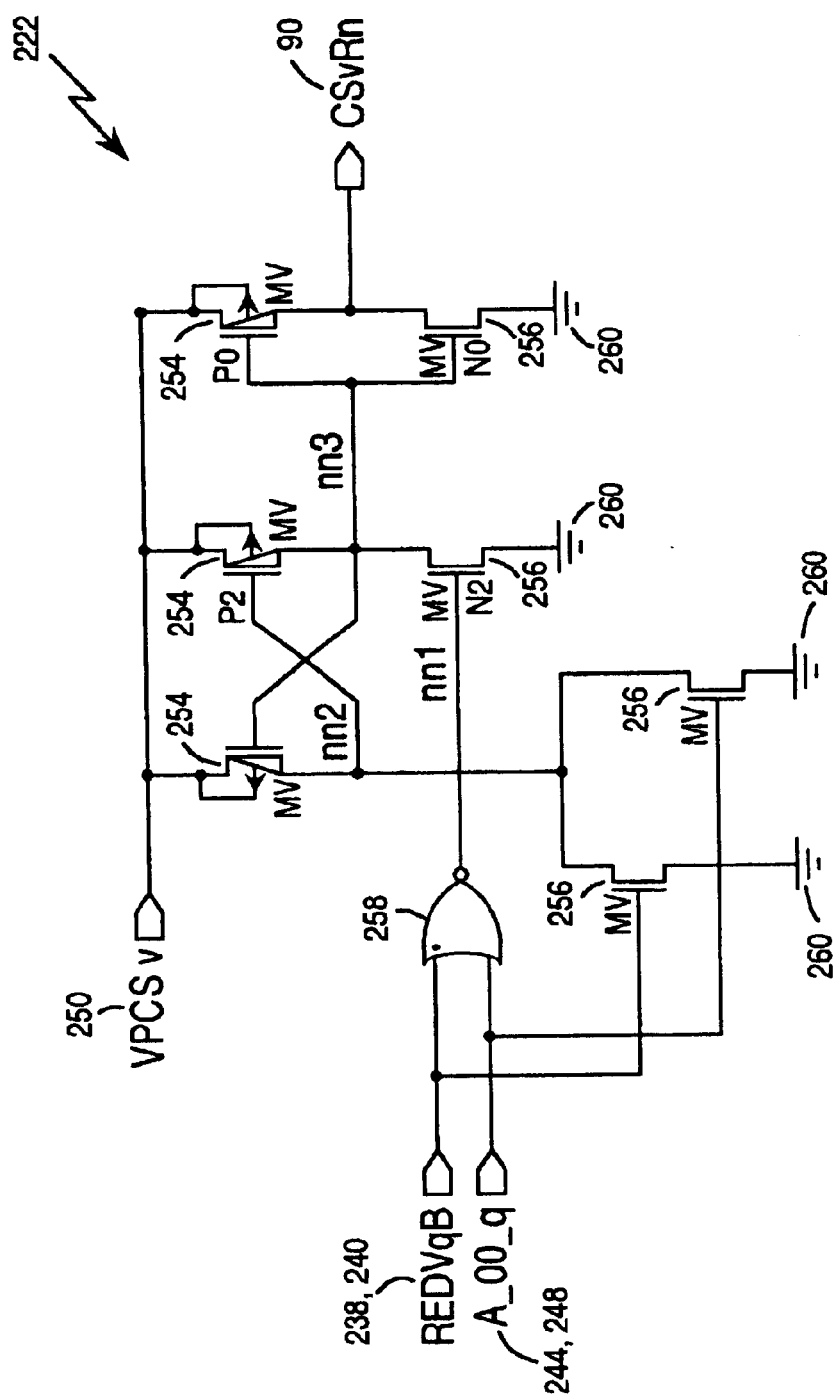
FIG. 10 is a schematic diagram of a presently preferred first redundant column select circuit illustrated in FIG. 9.

FIG. 10 is a circuit schematic of the presently preferred first redundant column select circuit (red_cs0) 222. The first redundant column select circuit (red_cs0) 222 includes a plurality of p-channel transistors 254, a plurality of n-channel transistors 256 and a NOR gate 258 electrically connected as illustrated. In addition, the first redundant column select circuit (red_cs0) 222 is electrically connected with the VPCSv power supply line 250 and a ground connection 258.

Each of the respective first redundant column select circuits (red_cs0) 222 provide a signal to a corresponding one of the respective the redundant metal1 sector select transistors 70. The redundant metal 1 sector select transistors 70 control activation of the metal2 redundant bitlines 68 as previously discussed in conjunction with FIG. 4. In the presently preferred embodiment, one of the first redundant column select circuits (red_cs0) 222 are used to control activation of each of the metal2 redundant bitlines 68 identified as "MBLvR(0)", "MBLvR(1)", "MBLvR(4)", "MBLvR(5)" in FIG. 4.

Referring now to FIGS. 9 and 10, the first redundant column select circuits (red_cs0) 222 operate as level shifters to electrically connect the redundant column select lines (CSvR"n") 90 with the VPCSv power supply line 250 or the ground connection 260. The reader should note that the "n" notation in the redundant column select lines (CSvR"n") 90 of FIG. 10 can equal 0,1,4 or 5 in different first redundant column select circuits (red_cs0) 222. Where 0,1,4 or 5 correspond to the metal2 redundant bitlines 68 identified as "MBLvR(0)", "MBLvR(1)", "MBLvR(4)", "MBLvR(5)" in FIG. 4. Each of the first redundant column select circuits (red_cs0) 222 are electrically connected with a respective column select line (CSvR"n") 90 as best illustrated in FIG. 9.

A particular first redundant column select circuit (red_cs0) 222 is activated by one of the redundant value lines (REDV"q"B ) 238, 240 and one of the logic lines (A_00_"q") 244, 248. The reader should again note that the "q" notation provided in FIG. 10 for the redundant value lines (REDV"q"B) 238, 240 and the logic lines (A_00_"q") 244, 248 can equal 1 or 2 (see FIG. 9). When the signals on the redundant value lines (REDV"q"B) 238, 240 and the logic lines (A_00_"q") 244, 248 are both logic low, the respective redundant column select line (CSvR"n") 90 is electrically connected with the VPCSv power supply line 250. When the signal on the redundant value lines (REDV"q"B) 238, 240 and/or the logic lines (A_00_"q") 244, 248 are logic high, the corresponding redundant column select line (CSvR"n") 90 is electrically connected with the ground connection 260. The redundant value lines (REDV"q"B) 238, 240 and the logic lines (A_00"q") 244, 248 are also electrically connected with a corresponding second redundant column select circuit (red_cs1) 224 as illustrated in FIG. 9.

Figure 11:
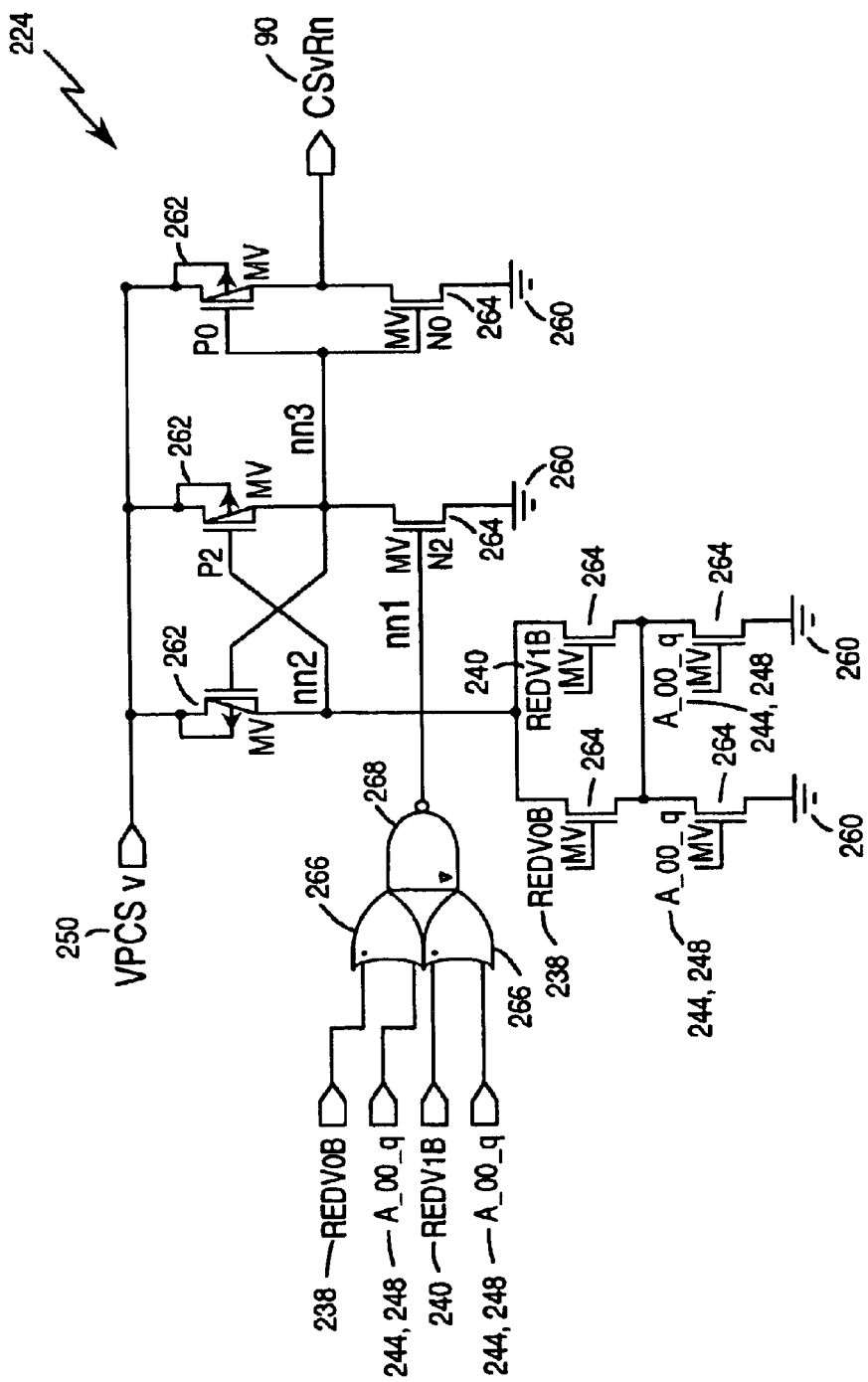
FIG. 11 is a schematic diagram of a presently preferred second redundant column select circuit illustrated in FIG. 9.

FIG. 11 is a circuit schematic of the presently preferred second redundant column select circuit (red_cs1) 224. The second redundant column select circuits (red_cs1) 224 each include a plurality of p-channel transistors 262, a plurality of n-channel transistors 264, a plurality of OR gates 266 and a NAND gate 268 electrically connected as illustrated. The second redundant column select circuits (red_cs1) 224 are also electrically connected to the VPCSv power supply line 250 and the ground connection.

Similar to the previously set forth first redundant column select circuits (red_cs0) 222, the presently preferred second redundant column select circuits (red_cs1) 224 are used to control activation of the metal2 redundant bitlines 68 identified as "MBLvR(2)" and "NMLvR(3)" in FIG. 4. Further, the second redundant column select circuits (red_cs1) 224 also operate as level shifters to electrically connect the redundant column select lines (CSvR"n") 90 (where "n"=2 or 3) with the VPCSv power supply line 250 or the ground connection 260.

Referring now to FIGS. 9 and 11, electrical connection of the redundant column select lines (CSvR"n") 90 with the VPCSv power supply line 250 will be explained. Electrical connection occurs when the redundant value zero line (REDV0B) 238, the redundant value one line (REDV1B) 240 and either the third or fourth logic lines (A_00_"q") 244 or 248 all provide logic low signals to the second redundant column select circuits (red_cs1) 224. Conversely, when one or more of the redundant value zero line (REDV0B) 238, the redundant value one line (REDV1B) 240 and either the third or fourth logic lines (A_00_"q") 244 or 248 are providing a logic high signal, the redundant column select line (CSvR"n") 90 is electrically connected with the ground connection 260. Addresses supplied to the redundant column select decoder circuits 204 selectively activate the first redundant column select circuit (red_cs0) 222 and/or the second redundant column select circuit (red_cs1) 224. The first redundant column select circuit (red_cs0) 222 and the second redundant column select circuit (red_cs1) 224 control activation of respective metal2 bitline select transistors 72 that were previously discussed with reference to FIG. 4.

Figure 12:
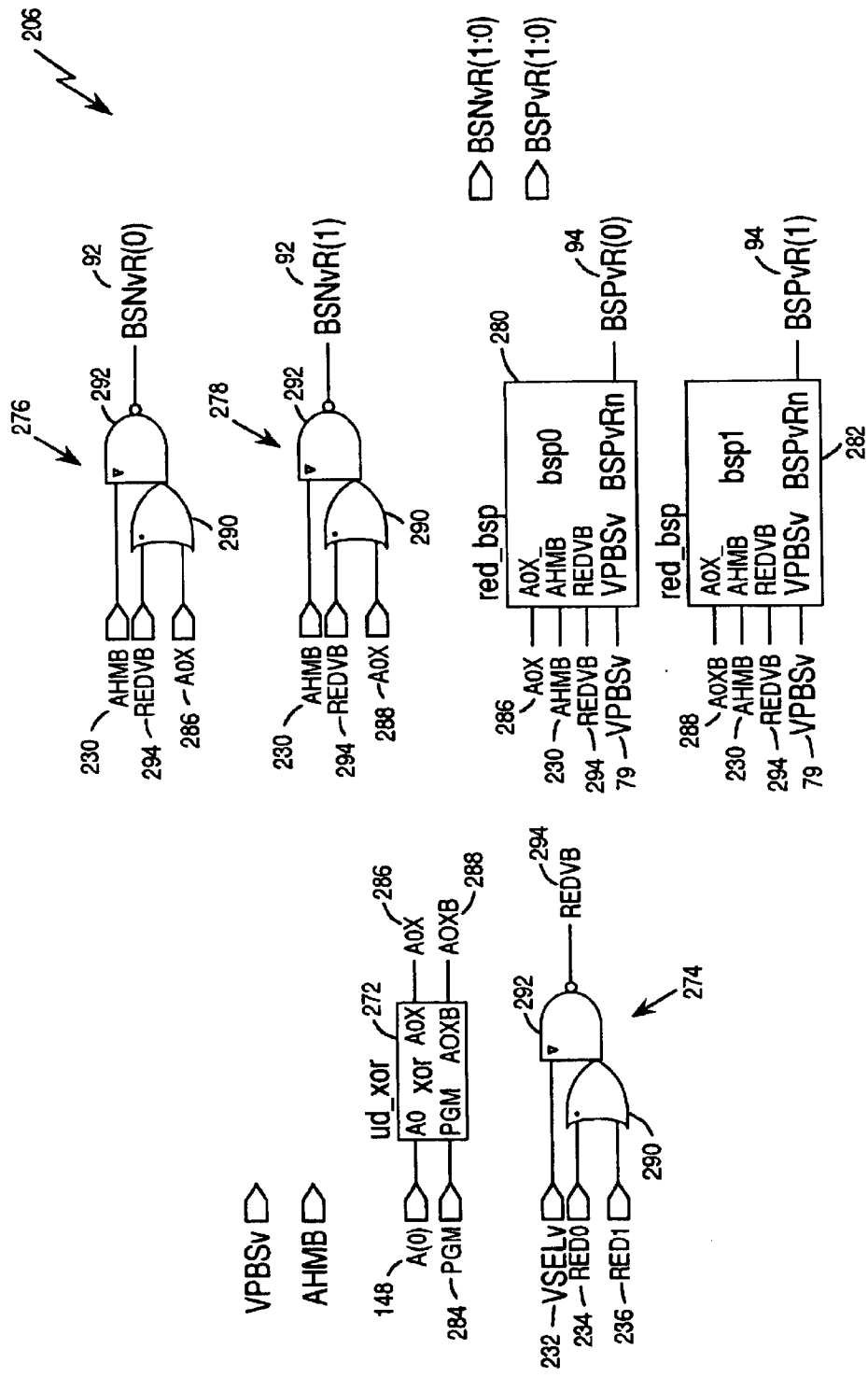
FIG. 12 is a schematic diagram of a presently preferred redundant byte select decoder circuit illustrated in FIG. 8.

FIG. 12 is a circuit schematic of the presently preferred redundant byte select decoder circuit 206 illustrated in FIG. 8. The redundant byte select decoder circuit 206 includes an XOR circuit 272, a first logic circuit 274, a second logic circuit 276, a third logic circuit 278, a first redundant byte select circuit 280 and a second redundant byte select circuit 282 electrically connected as illustrated. The redundant byte select decoder circuit 206 operates to control the redundant Y-select circuit 74 based on a portion of the addresses supplied from the addressing circuit 100.

The XOR circuit 272 performs traditional exclusive or logic using the A(0) bit of the addresses supplied on the A(0) line 148 and the signal provided on a programming line (PGM) 284. The program line provides a signal that is logic high to indicate the flash memory 10 is being programmed. The output of the XOR circuit 272 is provided on an A(0) XOR line (A0X) 286 and an A(0) XOR B line (A0XB) 288.

The first, second and third logic circuits 274, 276 and 278 each include an OR gate 290 and a NAND gate 292 electrically connected as illustrated. The first logic circuit 274 receives signals on the vertical select line (VSELv) 232, the redundant zero line (RED0) 234 and the redundant one line (RED1) line 236 to generate an output on a redundant select line (REDVB) 294. The redundant select line (REDVB) 294, the stress mode line (AHMB) 230 and the A(0) XOR line (AOX) 286 supply signals to the second logic circuit 276.

The resulting output from the second logic circuit 276 is provided on one of the redundant N byte select lines (BSNvR) 92. Specifically, the redundant N byte select line (BSNvR"0") 92 is identified with a "0" in FIG. 12 to correspond to the node zero 95, as previously set forth with reference to FIG. 4. Supply of voltage to the node zero 95 occurs by activating the corresponding n-channel transistor 78 illustrated in FIG. 4. Similarly, the third logic circuit 278 provides an output on the redundant N byte select line (BSNvR"1") 92 that is identified with a "1" in FIG. 12 to correspond to the node one 96; The output on the redundant N byte select line (BSNvR) 92 is based on the signals supplied on the redundant select line (REDVB) 294, the stress mode line (AM)230 and the A(0) XOR B line (AOXB) 288.

Figure 13:
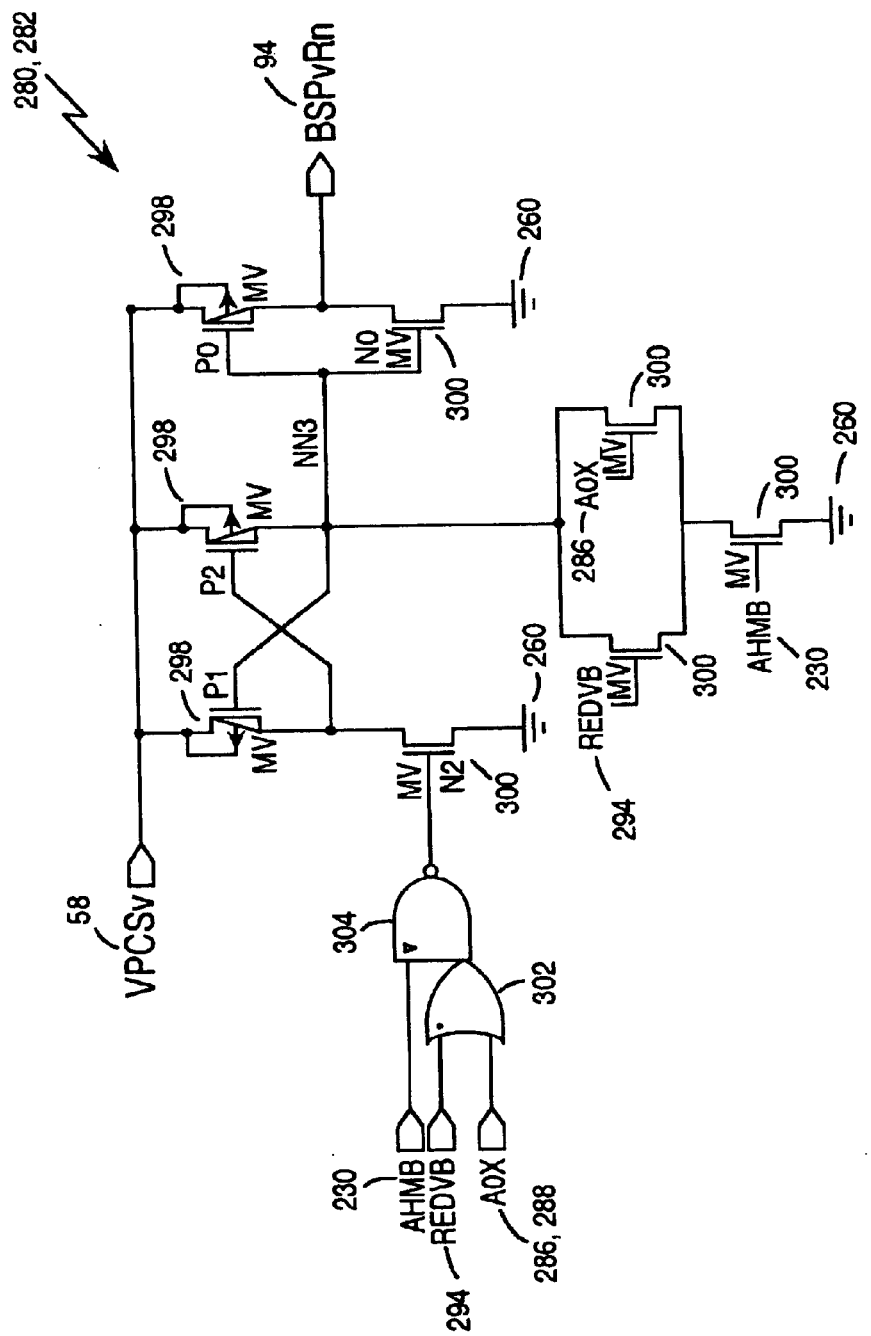
FIG. 13 is a schematic diagram of a presently preferred redundant byte select circuit illustrated in FIG. 12.

FIG. 13 is a circuit schematic of the first or second byte select circuits 280 or 282 illustrated in FIG. 12. The presently preferred first and second byte select circuits 280, 282 each include a plurality of p-channel transistors 298, a plurality of n-channel transistors 300, an OR gate 302 and a NAND gate 304 electrically connected as illustrated. In addition, the first and second byte select circuits 280, 282 are each electrically connected with the power supply line (VPBSv) 58 and the ground connection 260. Representation of the first and second byte select circuits 280, 282 with one circuit includes the designation A0X_. The designation AOX_ is used to represent that the first byte select circuit 280 is electrically connected with the A(0) XOR line (AOX) 286 and that the second byte select circuit 282 is electrically connected with the A(0) XOR B line (AOXB) 288.

Referring now to FIGS. 12 and 13, the first and second byte select circuits 280, 282 operate to electrically connect the redundant P byte select lines (BSPvR) 94 to the power supply line (VPBSv) 58 or the ground connection 260. The output of the first byte select circuit 280 is provided to one of the redundant P byte select lines (BSPvR) 94 that is identified with a "0" as illustrated in FIG. 12. The "0" designates that the output of the first byte select circuit 280 corresponds to the node zero 95 as illustrated in FIG. 4.

Similarly, the "1" identification on the redundant P byte select line (BSPvR) 94 that is electrically connected with the second byte select circuit 282 corresponds to the node one 96. The redundant P byte select lines (BSPvR"n") 94 illustrated in FIG. 13 include the designation "n" where n can equal 0 or 1 to further illustrate this point.

The first and second byte select circuits 280, 282 operate as an inverting level shifter. When signals on the redundant select line (REDVB) 294 and the A(0) XOR line (AOX__) line 286 or 288 are both logic low, the power supply line (VPBSv) 58 is electrically connected with the redundant P byte select lines (BSPvR"n") 94. Conversely the redundant P byte select lines (BSPvR"n") 94 are electrically connected with the ground connection 260 when signals on the redundant select line (REDVB) 294 and/or the A(0) XOR line (AOX__) 286 or 288 are logic high. Accordingly, the redundant byte select decoder circuits 206 control the voltage supplied to the node zero 95 and the node one 96. The voltage is controlled by controlling activation of the p-channel transistors 76 and the n-channel transistors 78 of the redundant Y-select circuit 74 as discussed with reference to FIG. 4.

FIG. 14 is a logic table illustrating the logic within the presently preferred redundant column select decoder circuits 204 and the presently preferred redundant byte select decoder circuits 206. The shading in the table of FIG. 14 indicates the redundant byte select lines (BSNvR, BSPvR) 92, 94 and the redundant column select lines (CSvR) 90 that selectively activate the redundant two-bit memory cell array 24. Activation is based on a portion of the addresses and the selection of one of the redundant elements 82, 84. Based on the activation, the redundant BL voltage supply line (BLvR) 97 supplies predetermined voltages to one of the metal2 redundant bitlines 68 as indicated in a first column 296 labeled "BLvR supplied to" in FIG. 14. Similarly, the redundant CMI voltage supply line (CMIvR) 98 supplies predetermined voltages to one of the metal2 redundant bitlines 68 as indicated in a second column 298 labeled "CMIvR supplied to."

Within the redundant elements 82, 84 each row illustrated in FIG. 14 activates the metal2 redundant bitlines 68 that correspond to a bit in one of the redundant two-bit memory cells 60, 64. For example, for redundant element zero 82, when the address lines A(0)–A(2) 144, 146, 148 are equal to 000, the metal2 redundant bitlines 68 for the bit identified as "*8" are selectively activated. Similarly, when the address lines A(0)–A(2) 144, 146, 148 are equal to 001, 010, 011, 100, 101, 110 and 111, the metal2 redundant bitlines 68 for the bits identified as "*1", "*2", "*3", "*4", "*5", "*6" and "*8", respectively, are selectively activated. Activation of the metal2 redundant bitlines 68 for the redundant element one 84 are similarly associated with the bits identified as "*16", "*09", "*10", "*11", "*12", "*13" "*14" and "*15."

Referring now to FIGS. 4, 8, 9, 12 and 14, the operation of the redundant column select decoder circuits 204 and the redundant byte select decoder circuits 206 will now be explained. The operation of the redundant column select decoder circuits 204 and the redundant byte select decoder circuits 206 are based on addresses from the addressing circuit 100. A portion of the addresses, namely, A(0), A(1), A(2) are provided on the A(0) line 148, the A(1) line 146 and the A(2) line 144. In addition, operation is based on identification of the redundant element zero 82 or the redundant element one 84 on the redundant element zero line (RED0) 234 or the redundant element one line (RED1) 236, respectively. As previously set forth, the signals on the redundant element zero line (RED0) 234 and the redundant element one line (RED1) 236 are generated by the program/read CAM circuit 112 based on the storage locations of the corresponding translated address.

Based on these input signals, logic high signals are selectively generated on the redundant byte select lines (BSNvR, BSPvR) 92, 94 and on the redundant column select lines (CSvR) 90. The logic high signals selectively activate the redundant metal2 bitline select transistors 72 and redundant Y-select circuit 74. Selective activation supplies voltage present on the redundant BL voltage supply line (BLvR) 97 and the redundant CMI voltage supply line (CMIvR) 98 to the metal2 redundant bitlines 68. Since the wordlines 26 and sector select lines 50 are activated simultaneously with core two-bit memory cell array 22, the redundant two-bit memory cells 60, 64 are selectively activated. The metal2 redundant bitlines 68 that are activated match the metal2 bitlines 34 of a repair block in the I/O block 18 in the core memory cell array 22.

For example, take the case where the portion of the address is 0000 for the part of the address A(0) through A(3) and the redundant element is designated as the redundant element zero 82. This condition is illustrated in the first row of the table in FIG. 14. The redundant P byte select line (BSPvR) 94 for redundant element zero 82 goes logic low. The corresponding p-channel transistor 76 is activated to pass voltage on the redundant BL voltage supply line (BLvR) 97 to the node zero 95. In addition, the redundant column select line (CSvR) 90 associated with the metal2 redundant bitline 68 identified as "MBLvR3" goes logic high activating the corresponding redundant metal2 bitline select transistor 72. As a result, the voltage present on the node zero 95 is passed to the metal2 redundant bitline 68 identified in FIG. 4 as "MBLvR3."

At the same time, the redundant N byte select line (BSNvR) 92 is raised to a logic high state thereby activating the corresponding n-channel transistor 78. The redundant column select line (CSvR) 90 associated with the metal2 redundant bitline 68 identified as "MBLvR2" goes logic high activating the corresponding redundant metal2 bitline select transistor 72. As a result, the voltage present on the redundant CMI voltage supply line (CMIvR) 98 is passed to the node one 96 and to the metal2 redundant bitline 68 identified in FIG. 4 as "MBLvR2."

The reader should note that operation of the redundant Y-decoder circuit 106 in activating the metal2 redundant bitlines 68 does not always correspond to individual activation of the redundant elements zero and one 82, 84. Rather, the metal2 redundant bitlines 68 that are activated are operable to supply voltages to the right and left regions of the redundant two-bit memory cell 60, 64 that is selected by the portion of the address, as previously discussed. In the above example, the metal2 redundant bitline 68 identified as "MBLvR2" is in the redundant element zero 82. However, the metal2 redundant bitline 68 identified as "MBLvR3" is in the redundant element one 84. Similarly, activation of the first edge MBL 80 and the second edge MBR 86 activate metal2 redundant bitlines 68 based on the portion of the particular address.

Referring now to FIGS. 1 and 5, at the same time the redundant two-bit memory cell array 24 is selectively configured by the redundant Y-decoder circuit 106, the comparator circuit 114 receives the translated address of the column of two-bit memory cells 32 that are active. The translated address is provided by the address translation circuit 110 based on a portion of the address received from the addressing circuit 100.

The comparator circuit 114 identifies a match with one of the translated addresses previously stored in the program/read CAM circuit 112 and activates the control circuit 116. The control circuit 116 deactivates a repair block in one of the I/O blocks 18 of the core two-bit memory cell array 22 that corresponds to the translated address. In addition, the control circuit 116 activates the portion of the redundant two-bit memory cell array 24 configured by the redundant Y-decoder circuit 106 thereby effecting the repair. Since the redundant two-bit memory cell array 24 is selectively configured to match the repair block, overall operation of the flash memory 10 is relatively unaffected by the repair.

The presently preferred flash memory 10 includes a non-sequential bit layout in the core two-bit memory cell array 22. Nonetheless, the flash memory 10 is capable of I/O based redundancy. The decoding of the addresses for the I/O based redundancy is accomplished using the address translation circuit 110 and the redundant Y-decoder circuit 106. The decoding provides translated addresses that correspond to a repair block in one of the I/O blocks 18 within the core two-bit memory cell array 22. In addition, the decoding provides the selective configuration of the redundant columns of two-bit memory cells 62 that will match the repair block identified by the translated address.

It is, therefore, intended that the foregoing detailed description be regarded as illustrative rather than limiting, and that it be understood that it is the following claims, including all equivalents, which are intended to define the spirit and scope of this invention.

What is claimed is:

1. An address decoding system for decoding addresses of two-bit memory cells generated by an addressing circuit to selectively activate an array of redundant two-bit memory cells and identify locations in a core memory cell array for use in I/O based redundancy in a memory device, the address decoding system comprising:
   an address translation circuit electrically connected with the addressing circuit that is operable to generate translated addresses based on a portion of the addresses, wherein the translated addresses identify locations in a core two-bit memory cell array; and
   a redundant Y-decoder circuit electrically connected with the addressing circuit that is operable to decode a portion of the addresses and selectively activate corresponding redundant two-bit memory cells.

2. The address decoding system of claim 1, wherein the locations in the core memory cell array are repair blocks.

3. The address decoding system of claim 2, wherein the repair blocks identify 8 bits in an I/O block in the core memory cell array.

4. The address decoding system of claim 2, wherein the repair blocks identify two metal2 bitlines in an I/O block in the core memory cell array.

5. The address decoding system of claim 1, wherein the redundant Y-decoder circuit comprises a redundant column select decoder circuit and a redundant byte select decoder circuit.

6. The address decoding system of claim 1, wherein the redundant Y-decoder circuit is operable to configure the redundant memory cells that are selectively activated to match the configuration of the core memory cell array in the location identified by the translated addresses.

7. The address decoding system of claim 1, wherein the core memory cell array comprises I/O blocks, wherein each I/O block comprises 128 bits.

8. The address decoding system of claim 7, wherein a zero bit is positioned on a right edge of each I/O block and a one bit is positioned on a left edge of each I/O block.

9. The address decoding system of claim 1, wherein the redundant memory cells include edge redundant memory cells, wherein the edge redundant memory cells are operable to store one bit.

10. The address decoding system of claim 1, wherein the memory cells include edge memory cells, wherein the edge memory cells are operable to store one bit.

11. A memory device with I/O based redundancy that includes a plurality of two-bit memory cells disposed in a core two-bit memory cell array and a plurality of redundant two-bit memory cells disposed in a redundant two-bit memory cell array wherein the core two-bit memory cells are accessed using addresses provided by an addressing circuit, the I/O based redundancy comprising:
   an address translation circuit electrically connected with the addressing circuit, wherein the address translation circuit is operable to receive a portion of the addresses and generate translated addresses;
   a redundant Y-decoder circuit electrically connected with the addressing circuit operable to decode the addresses and activate corresponding redundant two-bit memory cells;
   a program/read CAM circuit electrically connected with the address-translation circuit operable to store the translated addresses;
   a comparator circuit electrically connected with the address translation circuit and the program/read CAM circuit operable to compare the translated addresses stored in the program/read CAM circuit with translated addresses that correspond to two-bit memory cells that are active; and
   a control logic circuit electrically connected with the comparator circuit that is operable to deactivate the two-bit memory cells that are active and activate corresponding redundant two-bit memory cells when the translated addresses stored in the program/read CAM circuit match the translated addresses that correspond to the two-bit memory cells that are active.

12. The memory device of claim 11, wherein the translated addresses correspond to the location of repair blocks in the core two-bit memory cell array.

13. The memory device of claim 12, wherein the redundant Y-decoder circuit is operable to decode the redundant two-bit memory cell array to activate a plurality of redundant two-bit memory cells that match the configuration of the repair block.

14. The memory device of claim 11, wherein the redundant Y-decoder circuit comprises a redundant column select decoder circuit and a redundant byte select decoder circuit.

15. The memory device of claim 11, wherein the memory device is a flash memory.

16. The memory device of claim 11, further comprising a plurality of redundant blocks.

17. The memory device of claim 16, wherein the program/read CAM circuit comprises a plurality of storage locations that correspond to a particular redundant block and a redundant element in the memory device.

18. The memory device of claim 16, wherein the redundant two-bit memory cell array includes a sensing amp within each redundant block.

19. The memory device of claim 11, wherein the core two-bit memory cell array comprises I/O blocks, wherein each I/O block comprises 128 bits.

20. The memory device of claim 19, wherein a zero bit is positioned on a right edge of each I/O block and a one bit is positioned on a left edge of each I/O block.

21. A method of decoding addresses of two-bit memory cells generated by an addressing circuit to selectively activate redundant two-bit memory cells and provide corresponding locations of the two-bit memory cells for use in I/O based redundancy in a memory device, comprising the acts of:

generating translated addresses with an address translation circuit based on a portion of the addresses, wherein the translated addresses provide corresponding locations of the two-bit memory cells;

decoding a portion of the addresses with a redundant Y-decoder circuit; and selectively activating corresponding redundant two-bit memory cells.

22. The method of claim 21, comprising the additional act of storing the translated addresses in a program/read CAM circuit.

23. The method of claim 22, comprising the further act of comparing the translated addresses that were stored with a translated address of two-bit memory cells that are active.

24. The method of claim 23, comprising the further act of electrically exchanging the two-bit memory cells that are active with redundant two-bit memory cells when one of the translated addresses that were stored match the translated address of the two-bit memory cells that are active.

25. The method of claim 21, wherein the redundant two-bit memory cells are selectively activated to match the configuration of the two-bit memory cells in the corresponding locations provided by the translated addresses.

* * * * *